United States Patent
Furukawa et al.

(10) Patent No.: US 6,426,175 B2
(45) Date of Patent: *Jul. 30, 2002

(54) FABRICATION OF A HIGH DENSITY LONG CHANNEL DRAM GATE WITH OR WITHOUT A GROOVED GATE

(75) Inventors: Toshiharu Furukawa, Essex Junction; Mark C. Hakey; Stevn J. Holmes, both of MIlton; David V. Horak, Essex Junction; Paul A. Rabidoux, Winooski, all of VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,455

(22) Filed: Feb. 22, 1999

(51) Int. Cl.⁷ .................................................. G03C 5/00
(52) U.S. Cl. ........................... 430/313; 430/5; 430/314; 430/316; 430/317
(58) Field of Search .............................. 430/312, 313, 430/314, 319, 316, 317, 5; 438/197, 199, 257, 259, 270, 284, 695, 696, 700, 701, 702, 703

(56) References Cited

U.S. PATENT DOCUMENTS

| | | |
|---|---|---|
| 4,444,869 A | 4/1984 | Chonan et al. ............. 430/325 |
| 4,568,631 A | 2/1986 | Badami et al. ............. 430/315 |
| 4,612,274 A | 9/1986 | Cho et al. .................... 430/296 |
| 4,830,975 A | 5/1989 | Bovaird et al. ............... 437/41 |
| 4,988,284 A | 1/1991 | Liu et al. ..................... 430/296 |
| 5,079,131 A | 1/1992 | Thackeray et al. ......... 430/326 |
| 5,371,024 A | 12/1994 | Hieda et al. .................. 437/40 |
| 5,408,116 A | 4/1995 | Tanaka et al. .............. 257/327 |
| 5,550,008 A | 8/1996 | Tomo et al. ................. 430/325 |
| 5,620,918 A | 4/1997 | Kondoh ...................... 438/396 |
| 5,646,056 A | 7/1997 | Lin et al. ....................... 437/40 |
| 5,656,414 A | 8/1997 | Chou et al. .................. 430/312 |
| 5,691,215 A | 11/1997 | Dai et al. ...................... 437/44 |
| 5,728,506 A | 3/1998 | Kometani .................... 430/311 |
| 5,853,921 A | * 12/1998 | Moon et al. ................... 430/5 |
| 6,007,968 A | * 12/1999 | Furukawa et al. .......... 430/314 |

* cited by examiner

*Primary Examiner*—Mark F. Huff
*Assistant Examiner*—Saleha R. Mohamedulla
(74) *Attorney, Agent, or Firm*—Schmeiser, Olsen & Watts

(57) ABSTRACT

The present invention lengthens gate conductors used in memory chips to limit leakage current, while still allowing the overall size of cells to remain the same. The channel length for each gate is increased by decreasing the size of spaces between gates. Decreases in space size occurs by using photolithographic image enhancement techniques. These techniques allow the space between gate conductors to be smaller while the gate size increases. In addition, a groove may be added that additionally lengthens the effective channel length and provides an additional electrical shield to limit leakage current. These techniques lead to the same density memory cells for a given process with less leakage. Finally, if grooved gate structures are used, having a longer gate conductor allows a three sigma process to be used, which increases yields.

19 Claims, 29 Drawing Sheets

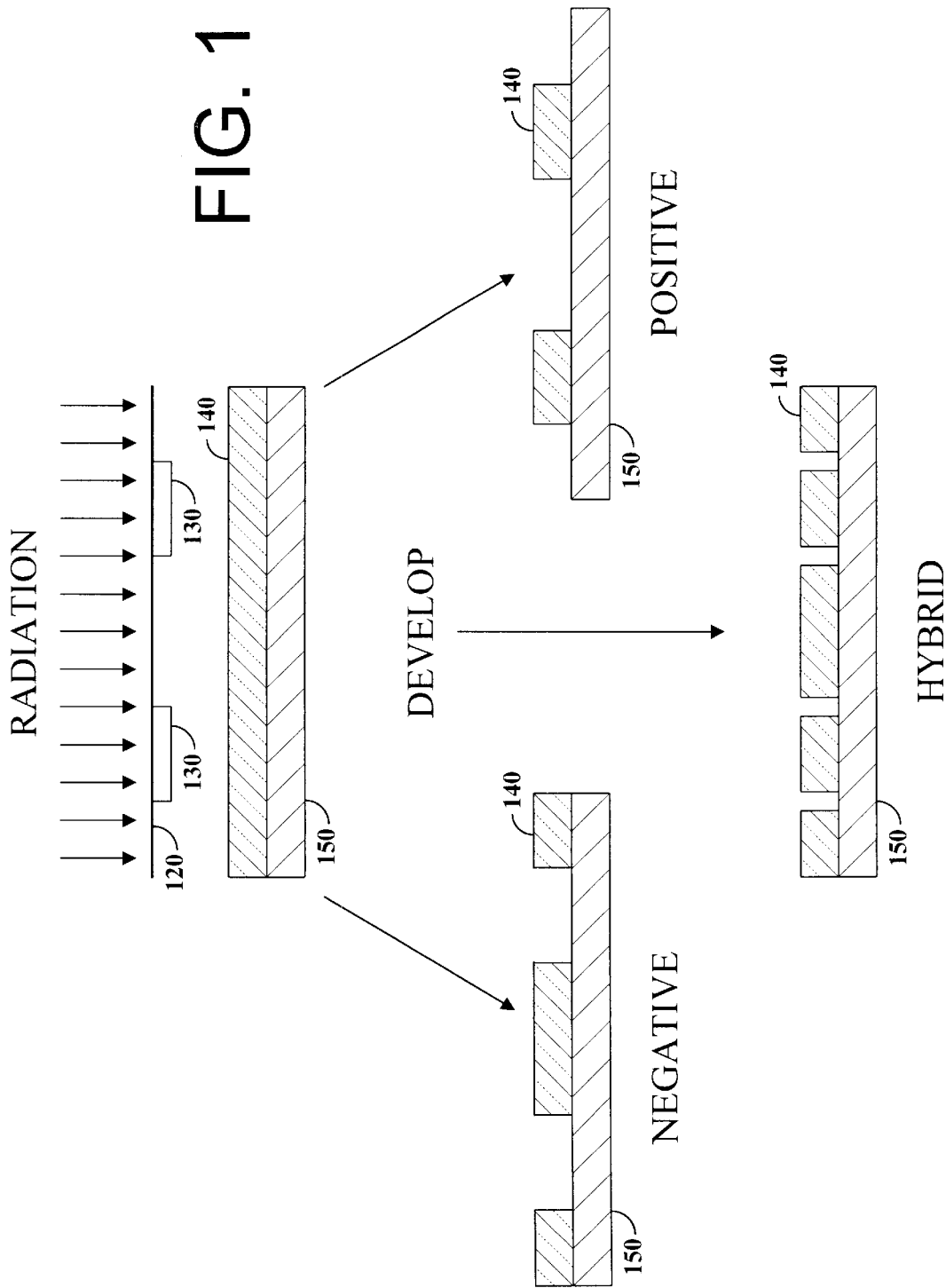

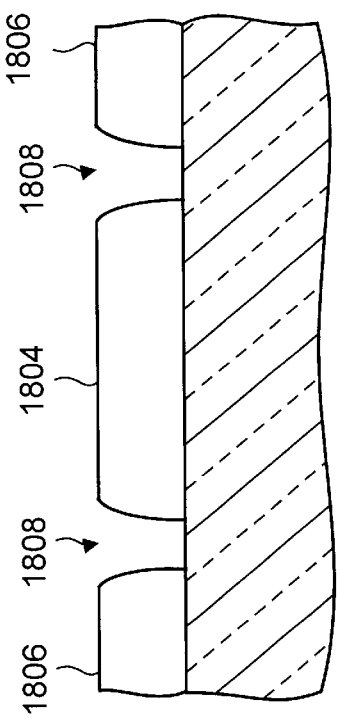
FIG. 19
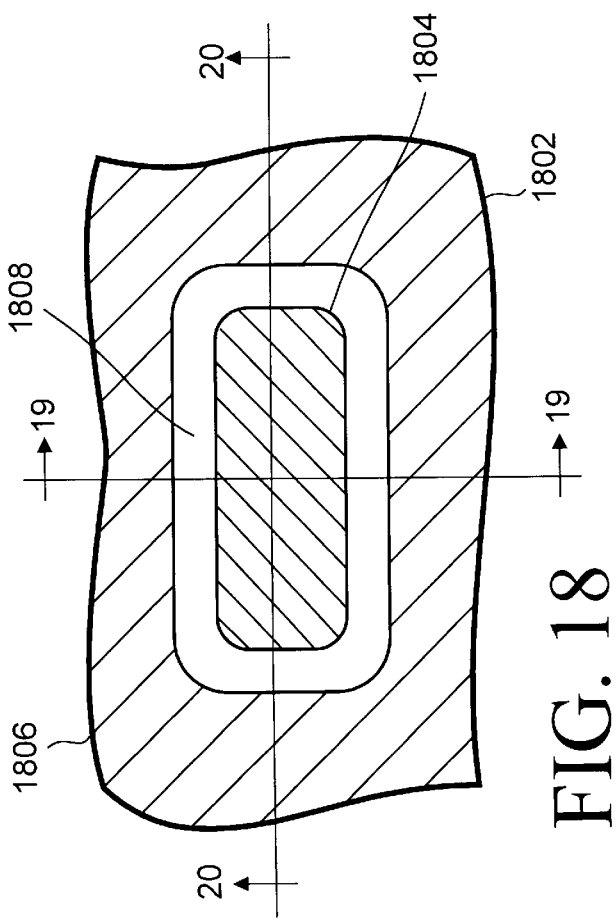
FIG. 20
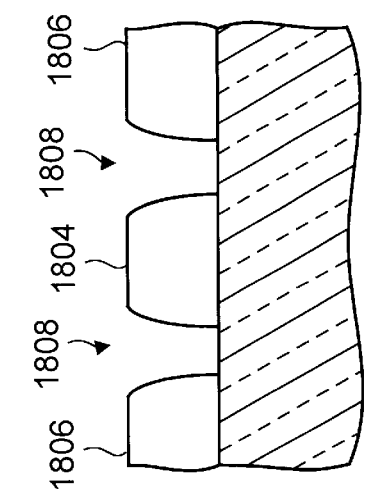
FIG. 17
FIG. 18

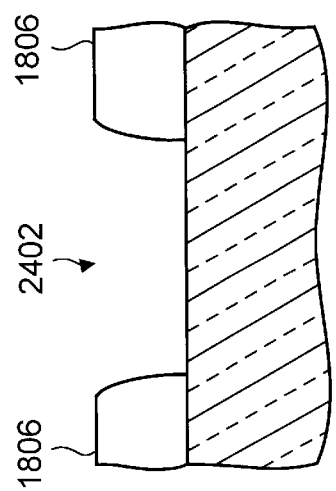
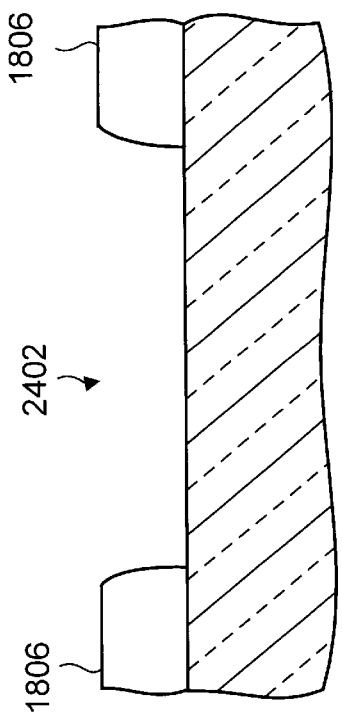
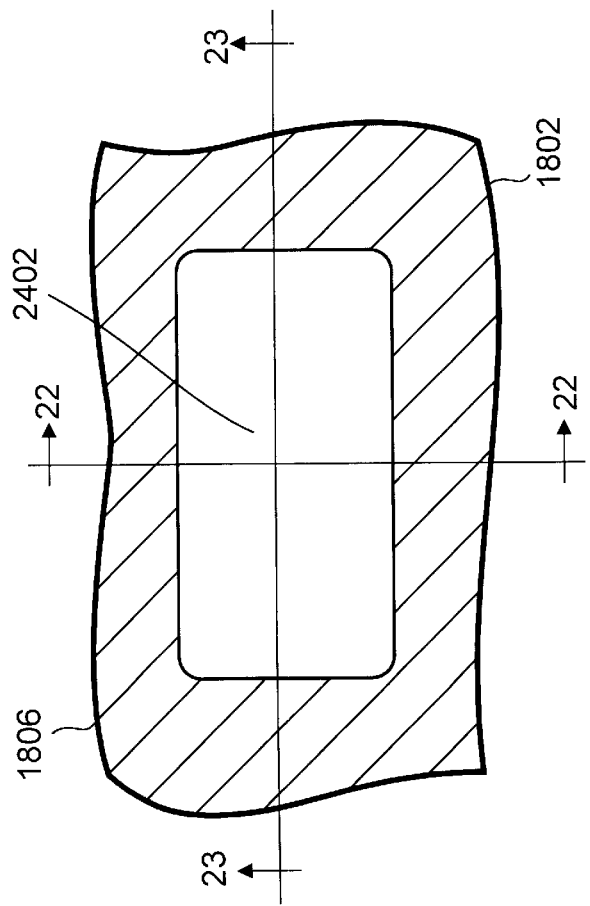

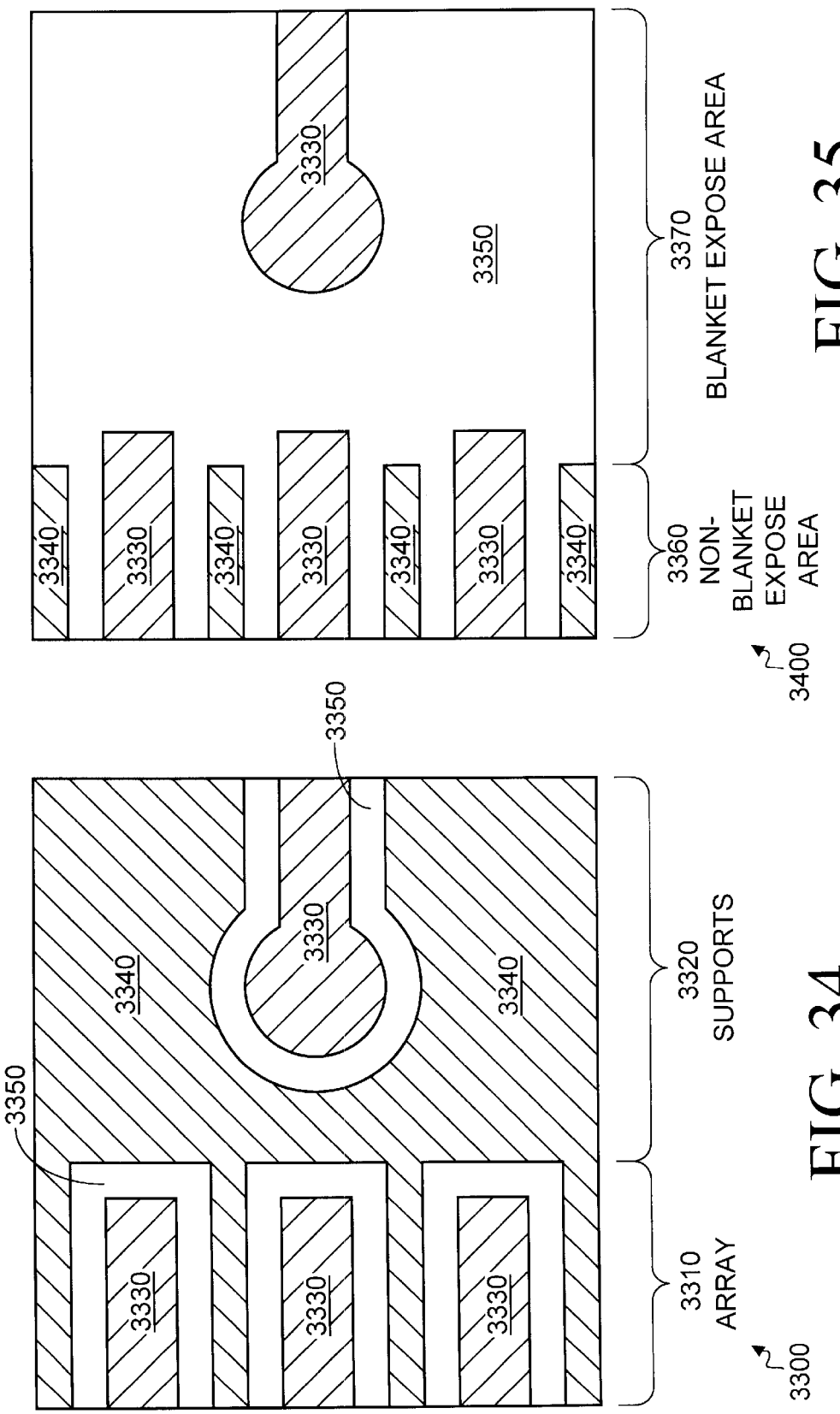

FABRICATION OF A HIGH DENSITY LONG CHANNEL DRAM GATE WITH OR WITHOUT A GROOVED GATE

RELATED APPLICATION

This application is related to an earlier filed application by Bronner et al., entitled "DRAM Cell with Grooved Transfer Device", Ser. No. 09/056,903 filed Apr. 7, 1998, now U.S. Pat. No. 5,945,707 and U.S. Pat. No. 6,037,194, and are incorporated herein by reference.

BACKGROUND OF THE INVENTION

1. Technical Field

The present invention relates generally to the field of semiconductor manufacturing and, more specifically, to forming long-channel gates, with or without grooves, in high-density Dynamic Random Access Memories (DRAM).

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in Dynamic Random Access Memory (DRAM) technologies, as more computers and peripherals come with higher amounts of DRAM in order to run the memory-intensive applications being developed. In addition, smaller sizes for DRAMs allow the semiconductor manufacturer to produce more DRAM chips with each silicon wafer, which increases productivity and profit.

A typical DRAM chip is made of millions of individual DRAM "cells." Each cell contains a capacitor used to store the memory charge, a switch used to access the capacitor, and some isolation regions around these devices. The individual cells are accessed using a large number of bit lines and word lines. By selecting an appropriate bit line and word line, a memory controller can write or read information into or from, respectively, the desired DRAM cells.

The density of a DRAM chip is determined in large part by the area needed for each DRAM cell. This area is often measured in terms of "squares," where a square comprises a 1 F×1 F square region where "F" is the minimum feature dimension that can be created using an aerial image in a given lithography system. Thus, an 8 SQ DRAM cell created by a 0.35 µm lithography system comprises an area of eight 0.35 µm by 0.35 µm squares on the chip. It is desirable to have the smallest area for each DRAM cell so that more cells can be packed into a smaller area.

Problems can arise with decreasing DRAM cell size, however. One important and potentially very serious problem is the associated decrease in capacitance that generally follows a decrease in cell size. It is desirable that each cell have a high capacitance because the capacitor stores the charge that will be subsequently read by the memory controller. All capacitors lose charge over time. Because of this, DRAM chips include circuitry that will periodically read and then refresh each and every cell in the chip. But it takes some time for the refresh circuitry to access and refresh each cell in the array, particularly when more cells are placed into an array. Each cell must maintain its charge until refreshed, and this time period could be quite long, particularly with DRAMs' increasing cell numbers and density.

In addition to lower capacitance, as cell sizes decrease, sub-threshold leakage tends to increase. Many of the causes of leakage actually decrease as cells and gate sizes decrease, but one important cause of leakage increases. This is drain induced barrier lowering, which occurs when the drain is charged to a high voltage and the source is a low voltage. In this leakage, the source essentially "steals" electric field from the drain. This causes the entire barrier between the drain and the source to be lowered. Drain induced barrier lowering becomes the predominant cause of leakage as cell and gate size decrease. This current leakage reduces the time that the capacitor will store a charge and can cause potential errors if charge from the capacitor is transferred to the bit line or vice versa.

Thus, the length of the gates in DRAM cells is important for controlling leakage current from and into the capacitors. The greater the leakage current, the quicker the cells must be refreshed. Unfortunately, with increasing density of cells on a chip, the refresh circuitry will take longer to refresh each cell. In addition, the increased density of cells comes by making each cell smaller. This causes each gate length, and the corresponding channel length under the gate, to also become small, which leads to increased sub-threshold leakage from DRAM capacitors.

Therefore, without a way to increase the length of the gates without increasing the size of cells, increasing density of cells in DRAMs will cause greater leakage current or errors and more complex and costly refresh circuitry to counteract the increased leakage.

DISCLOSURE OF INVENTION

Accordingly, the present invention lengthens gate conductors used in memory devices to limit leakage current, while still allowing the overall size of cells to remain the same. The channel length for each gate is increased by decreasing the size of spaces between gates. Decreases in space size occurs by using photolithographic image enhancement techniques. These techniques allow the space between gate conductors to be smaller while the gate size increases. In addition, a groove may be added that additionally lengthens the effective channel length and provides an additional electrical shield to limit leakage current. These techniques lead to the same density memory cells for a given process with less leakage. Finally, if grooved gate structures are used, having a longer gate conductor allows a three sigma process to be used, which increases yields.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and FIG. 1 is a schematic diagram showing the use of the hybrid resist;

FIG. 17 is a schematic view of an exemplary mask portion;

FIG. 18 is a top schematic view of a wafer portion with patterned hybrid resist upon it;

FIG. 19 is a cross-sectional side view of the wafer portion of FIG. 18 taken along line 19—19;

FIG. 20 is a cross-sectional side view of the wafer portion of FIG. 18 taken along line 20—20;

FIG. 21 is a top schematic view of a wafer portion with patterned hybrid resist and positive tone portions removed;

FIG. 22 is a cross-sectional side view of the wafer portion of FIG. 21 taken along line 22—22;

FIG. 23 is a cross-sectional side view of the wafer portion of FIG. 21 taken along line 23—23;

FIG. 28 is a method of making gates with hybrid photoresist and chromed masks in accordance with preferred embodiments of the present invention;

FIGS. 34 and 35 are top views of pre- and post-blanket exposure of a wafer, covered with hybrid resist, in accordance with a preferred embodiment of the present invention;

BEST MODE FOR CARRYING OUT THE INVENTION

Figure 3:
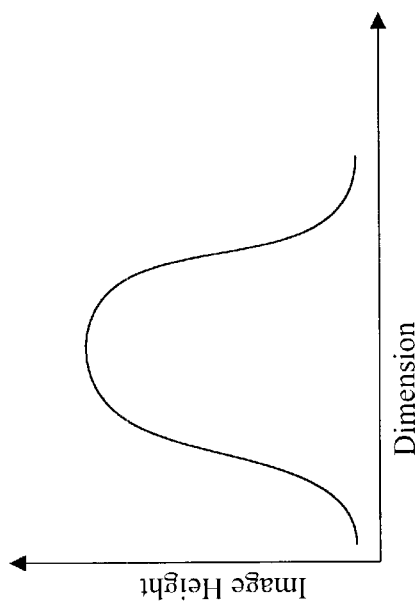
FIG. 3 is a graph illustrating the line pattern for positive resist printed with a reticle line pattern.

The preferred embodiments of the present invention overcome some of the limitations of the prior art and provide methods to form long channel gates, with and without grooves, in high density Dynamic Random Access Memories (DRAMs). The preferred embodiments use a longer gate to provide long channel lengths, while still providing for unchanged pitch sizes (e.g., the total length used for one structure). A preferred embodiment uses hybrid resist, which exhibits both positive and negative tone responses as well as an intermediate response, to define and form the grooved gate, if used, and the gate conductor. A second preferred embodiment uses negative resist and phase-change masks to define and form the grooved gate, if used, and gate conductor. A description of hybrid resist, phase edge processing, and a generalized DRAM structure will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 $\mu$m and less can be printed with current deep ultra violet (DUV) lithography tools that are designed for operation at 0.35 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage of the hybrid resist is the relaxation of the minimum reticle feature size due to the frequency doubling capability of hybrid resist. For example, to print a 0.2 μm feature with conventional resist generally requires a 0.2 μm reticle image size. With hybrid resist, a 0.2 μm space can be formed with a single edge of a reticle feature; for example, a 0.5 μm reticle opening could produce two 0.2 μm spaces and a 0.2 μm line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 μm and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
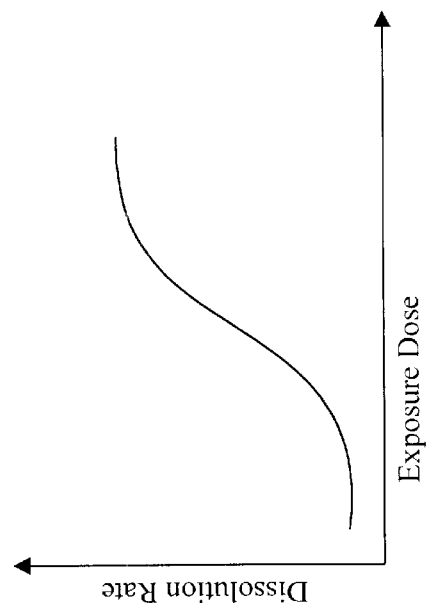
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 4:
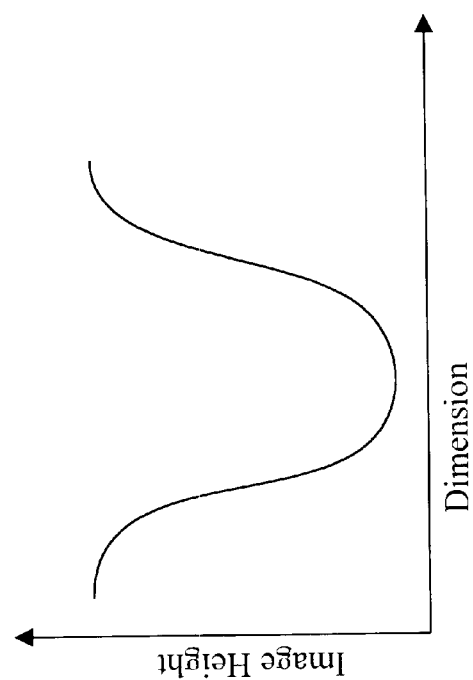
FIG. 4 is a graph illustrating how in negative resist systems exposed areas undergo a reduction in solubility as the exposure dose is increased.
Figure 5:
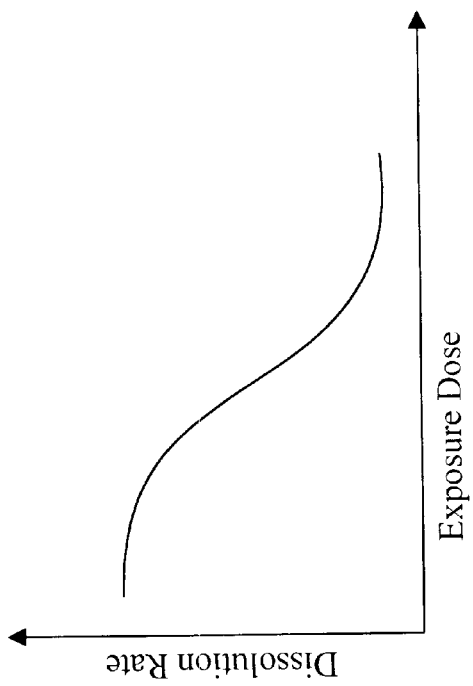
FIG. 5 is a graph illustrating the line pattern for negative resist printed with a reticle line pattern.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
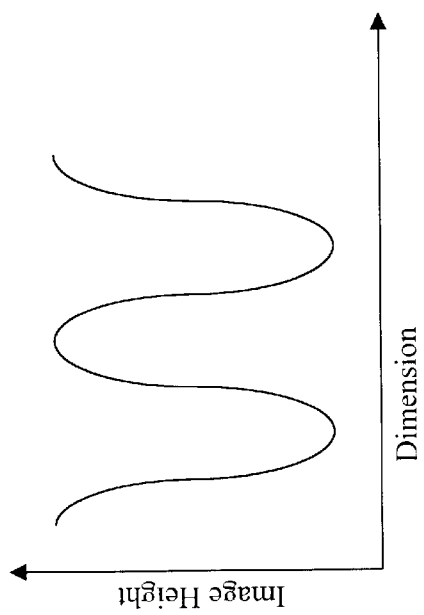
FIG. 7 is a graph illustrating the space/line/space pattern formed onto a substrate using hybrid resist.
Figure 6:
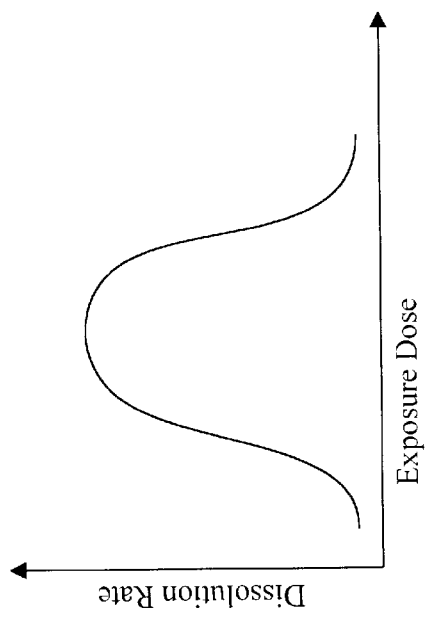
FIG. 6 is a graph of the resist solubility as a function of exposure dose for hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
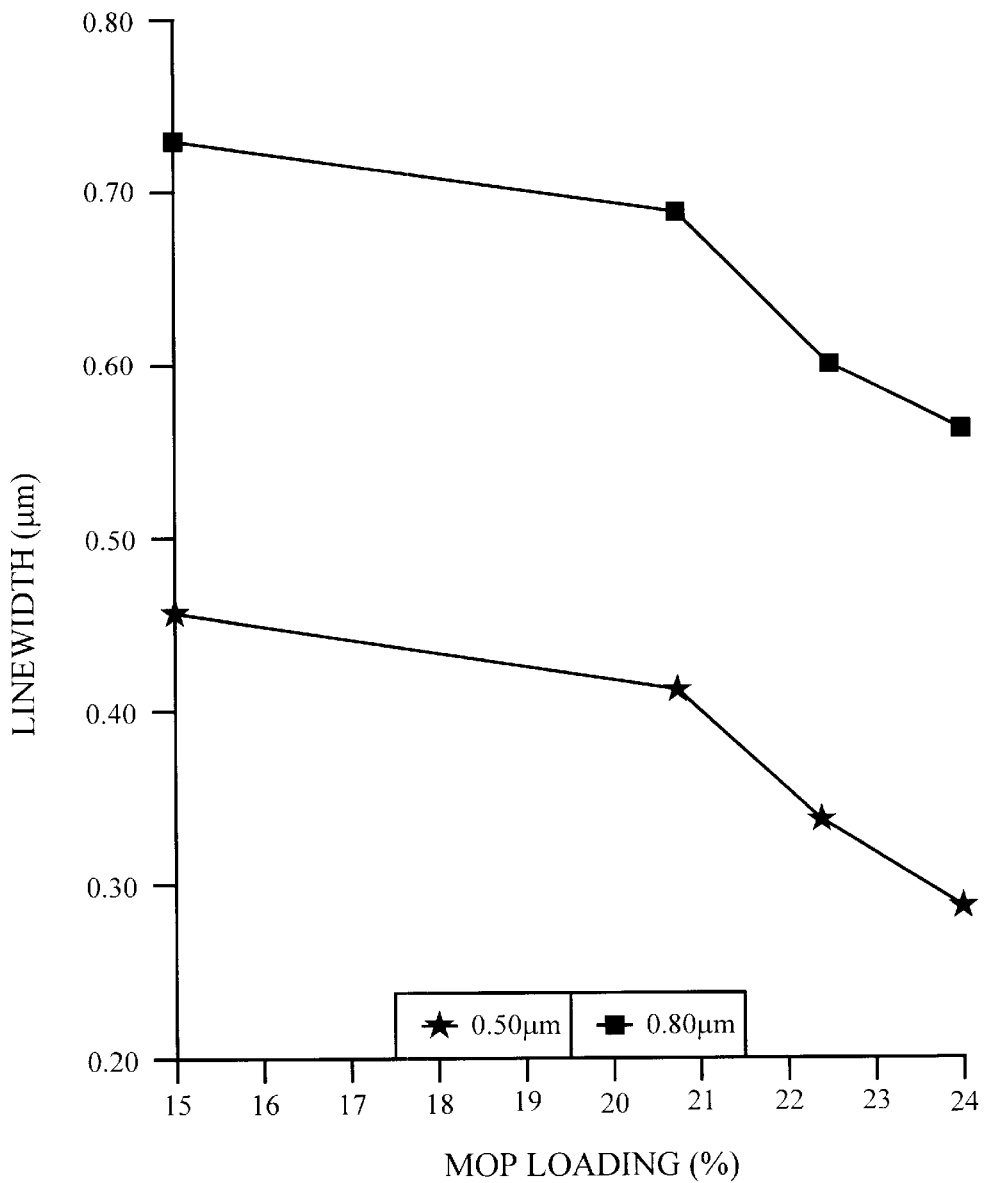
FIG. 10 is a graph showing the linewidth in nm plotted against the amount of positive tone solubility inhibitor (MOP) incorporated in a hybrid resist of the present invention.
Figure 15:
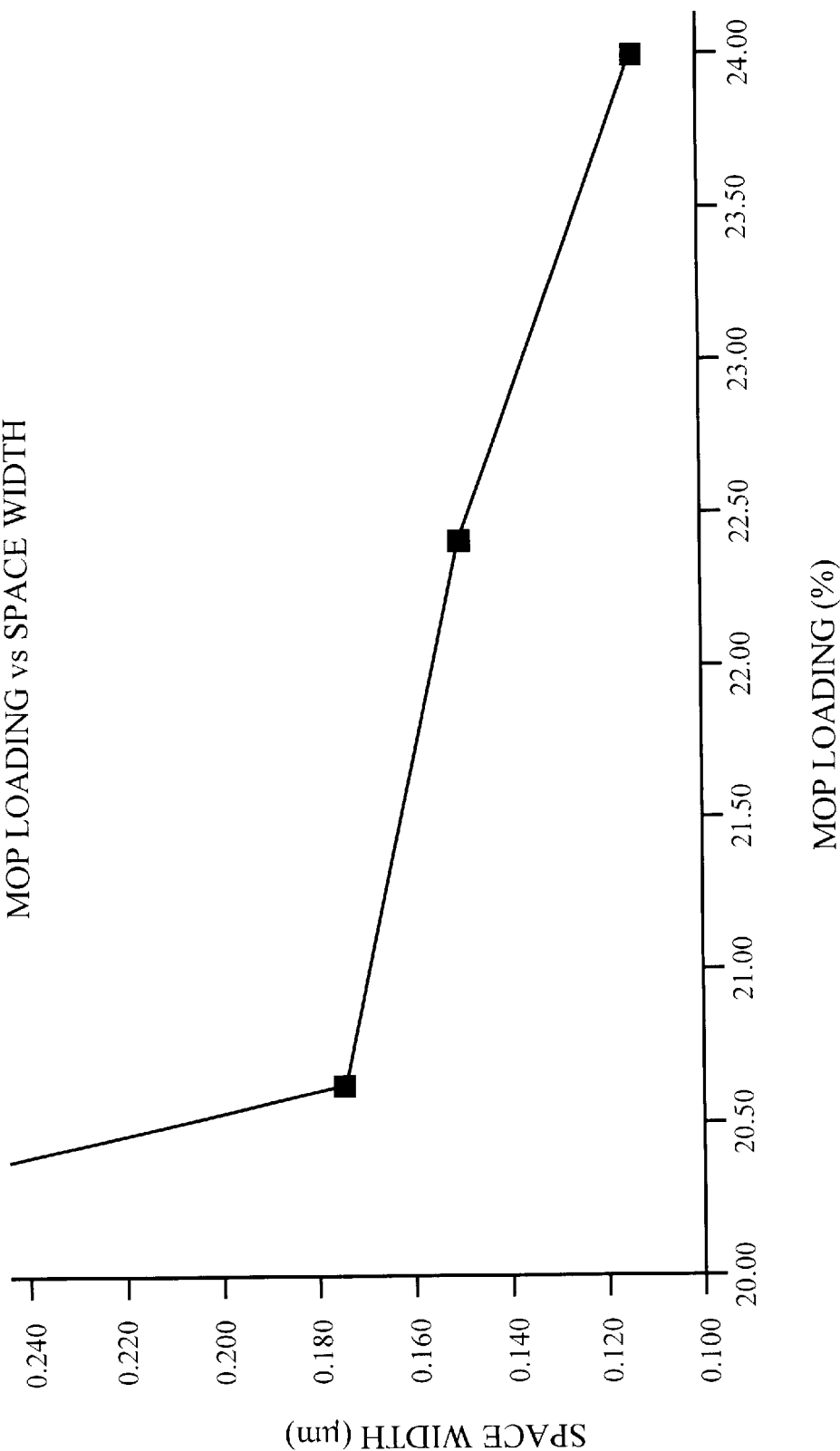
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
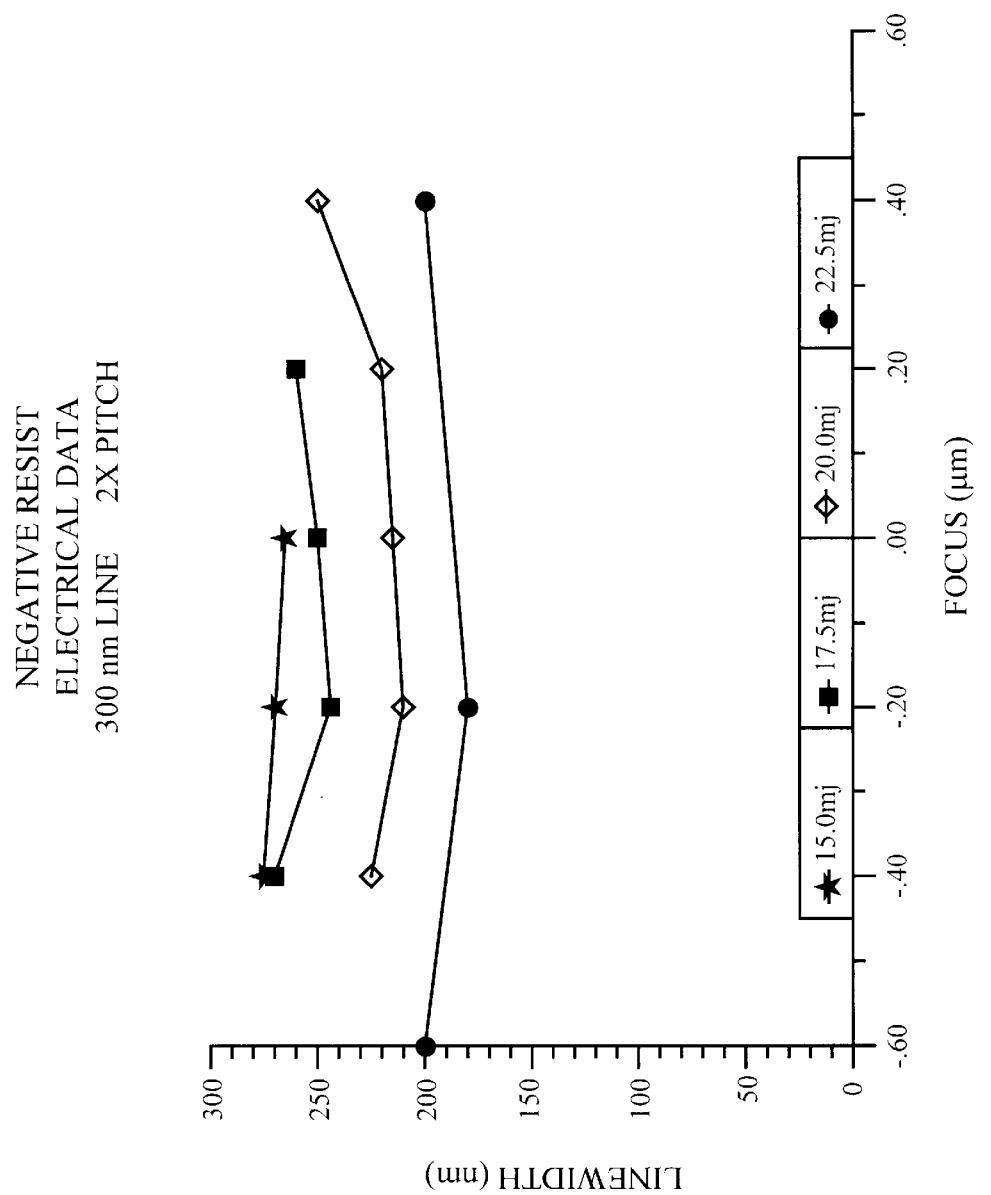
FIG. 8 is a graph of linewidth in nanometers (nm) plotted against focus in microns ($\mu$m) of a formulation of a standard negative resist at various exposure energies.
Figure 9:
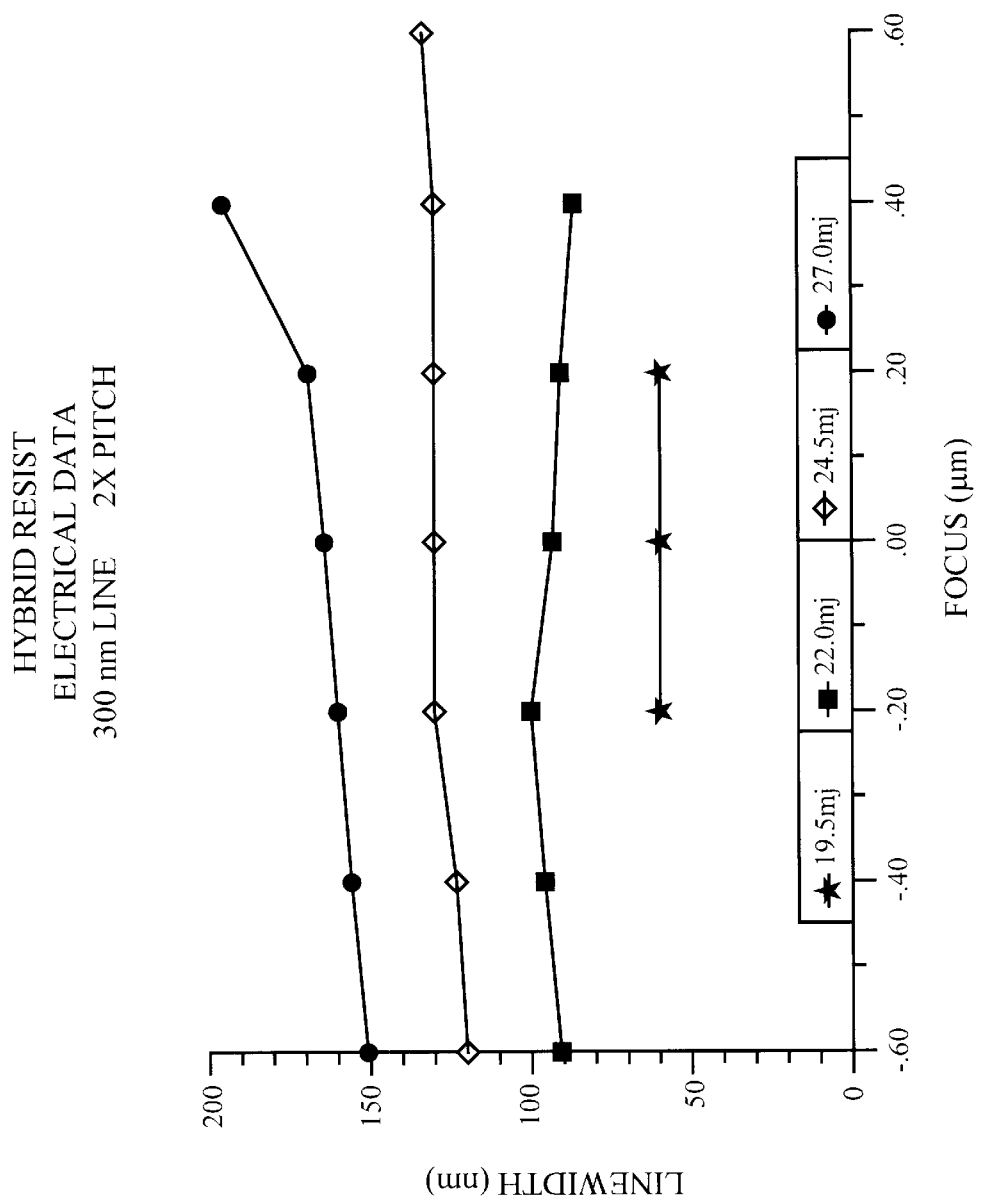
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
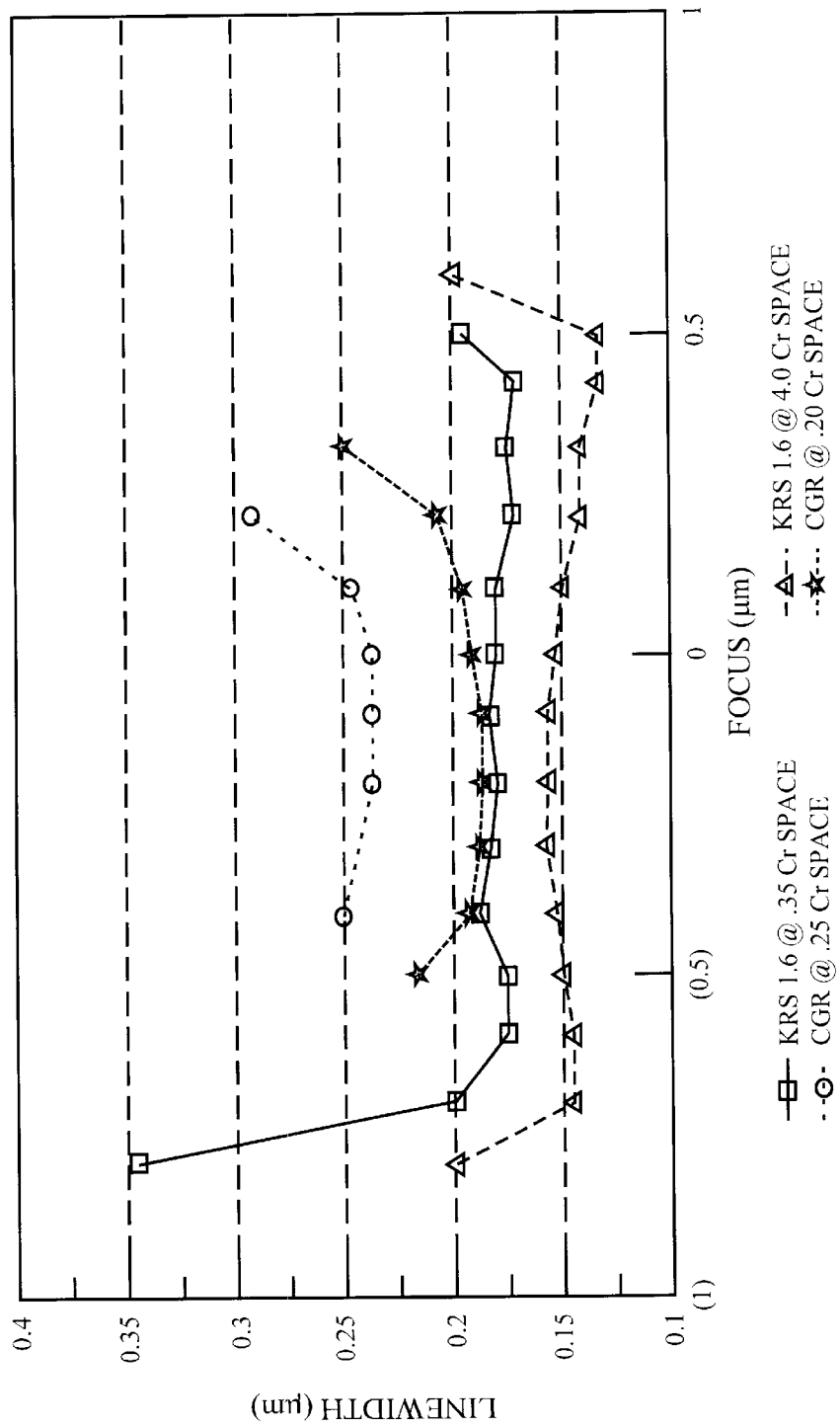
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.1 $\mu$m larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene co-polymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

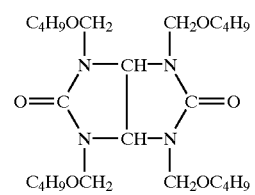

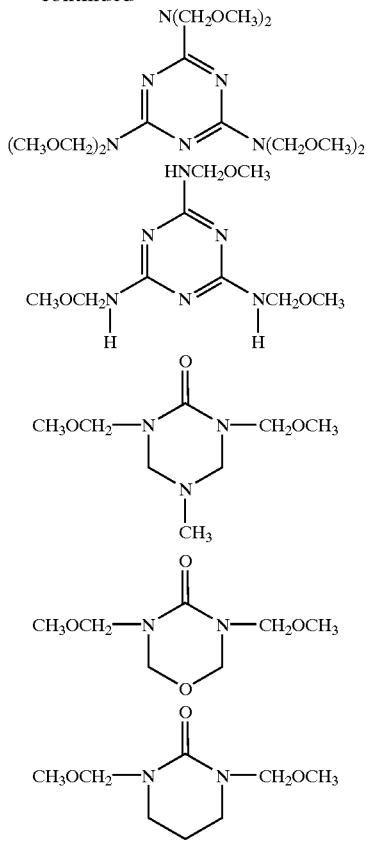

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

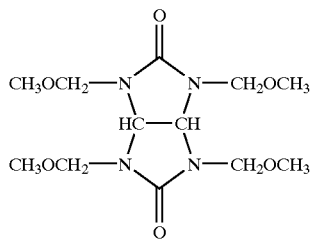

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 pmm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1 ]-hept-5-ene-2,3- dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

The solution was filtered through a 0.2 µm filter. The solution was coated onto silicon wafers primed with hexamethyl-disilazane with a soft bake of 110° Celsius (C.) resulting in films of about 0.8 µm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoules (mJ) to about 3 mJ. Increasing the dose further, the negative cross-linking chemistry becomes predominant and the dissolution rate falls back to a value close to zero.

Figure 13:
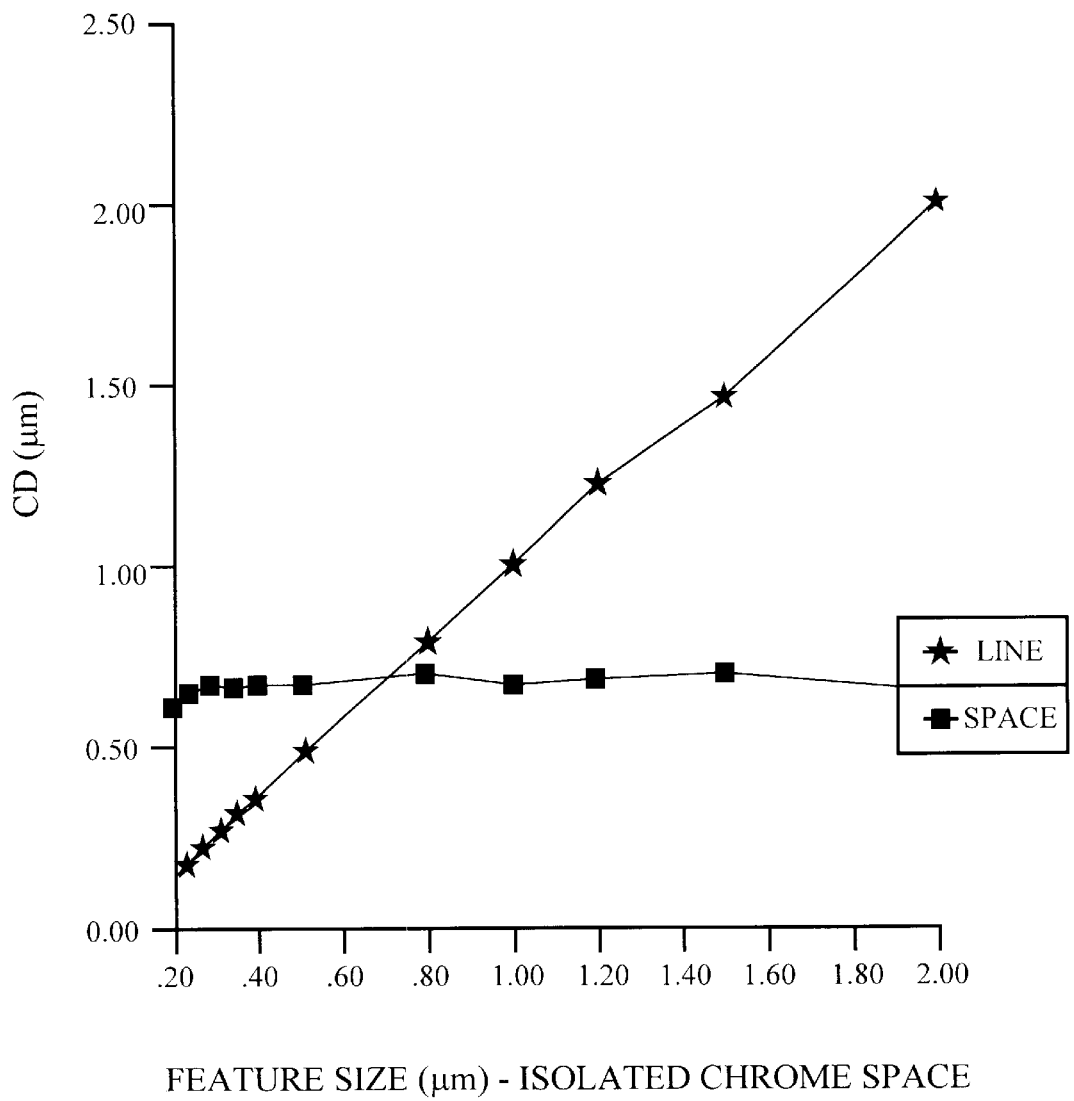
FIG. 13 is a graph showing the resultant line and space widths as functions of the chrome space width using one formulation of a hybrid resist of the present invention.

In another experiment with the same resist, when a MICRASCAN II 0.5NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350 pmm FC-430 surfactant as a solvent to form a 18.9% solids solution.

Figure 12:
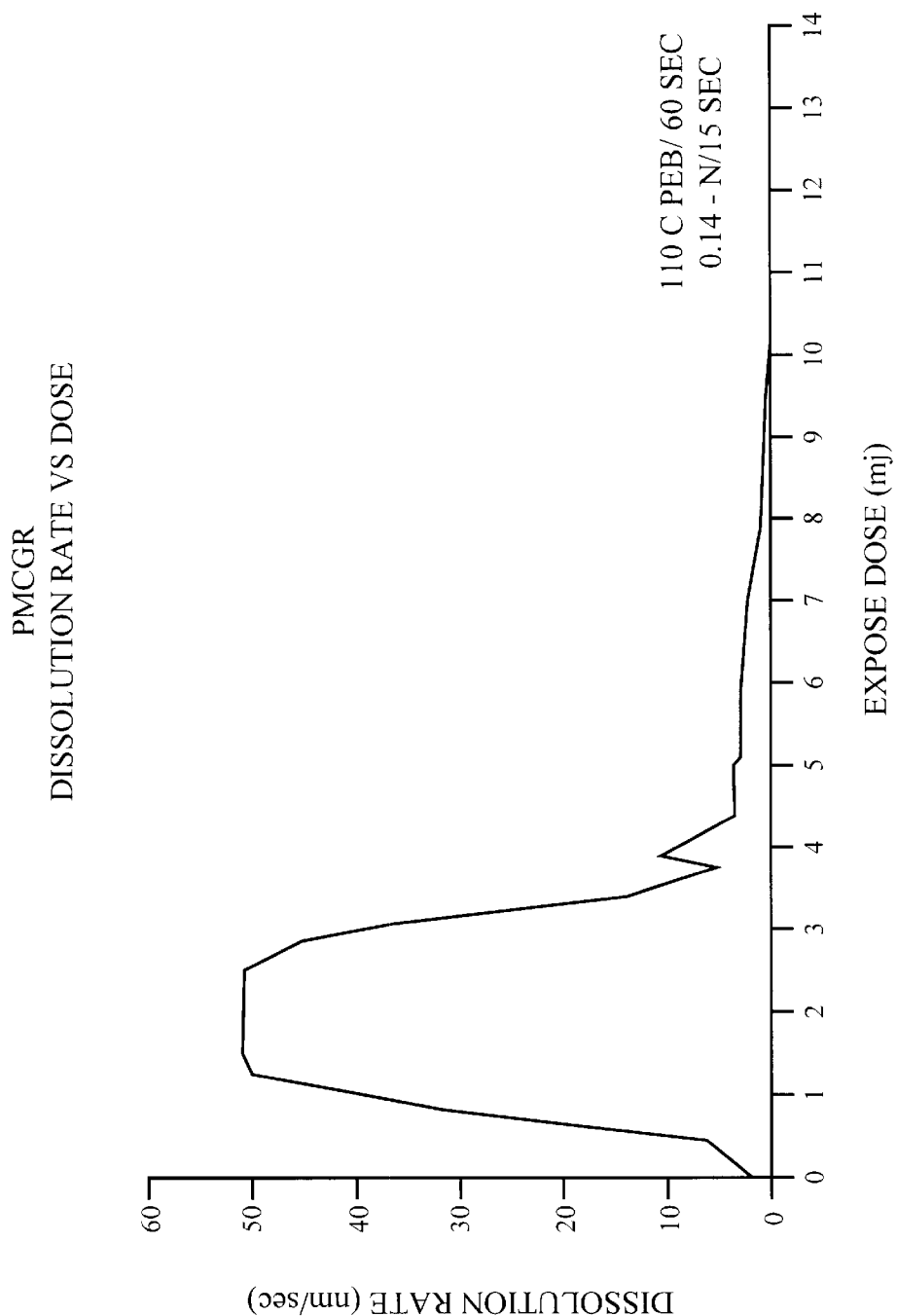
FIG. 12 is a graph showing the dissolution rate in nanometers per second (nm/sec) as a function of the exposure dose in milliJoules (mJ) using one formulation of a hybrid resist of the present invention.
Figure 14:
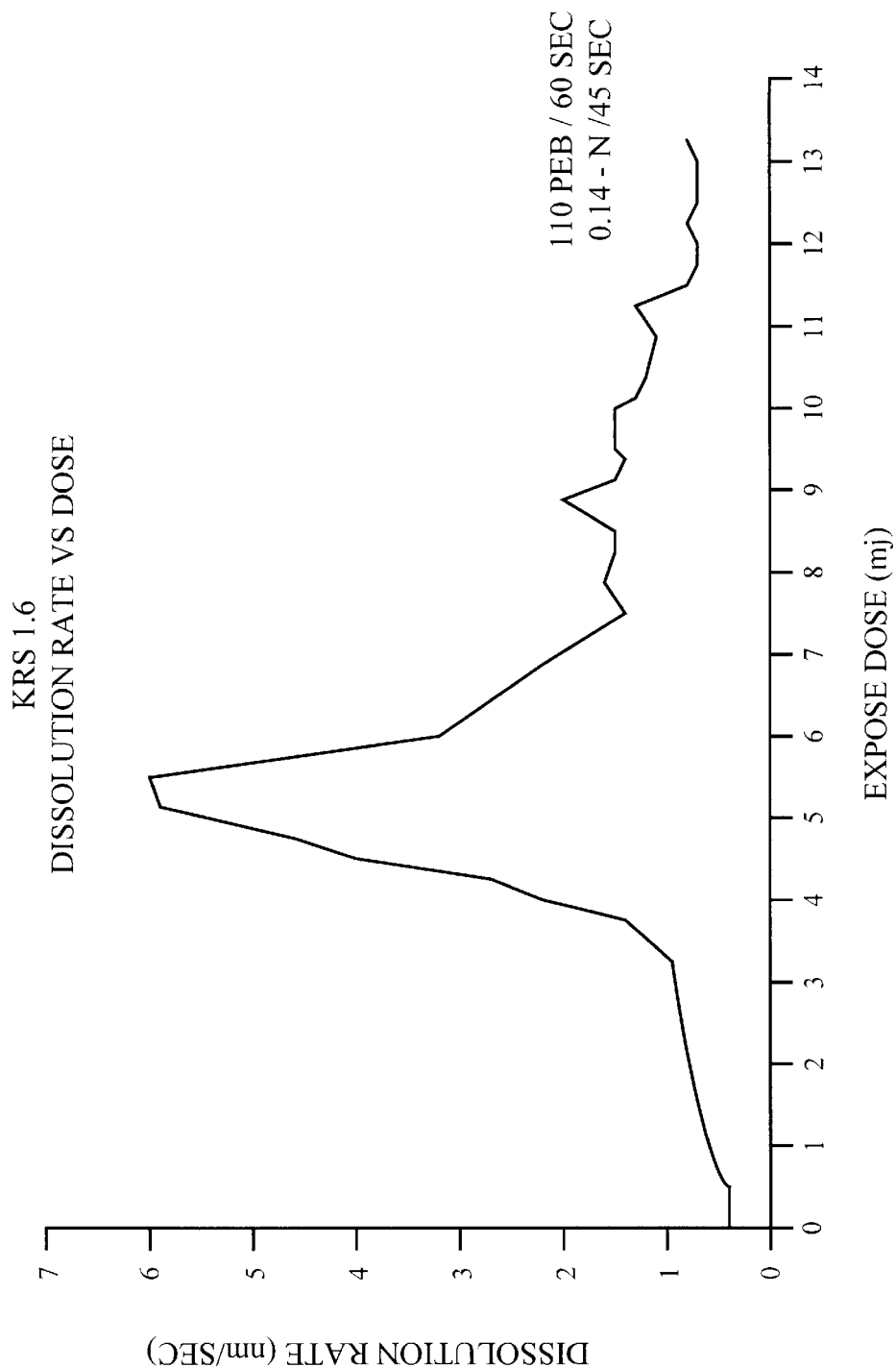
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

Figure 16:
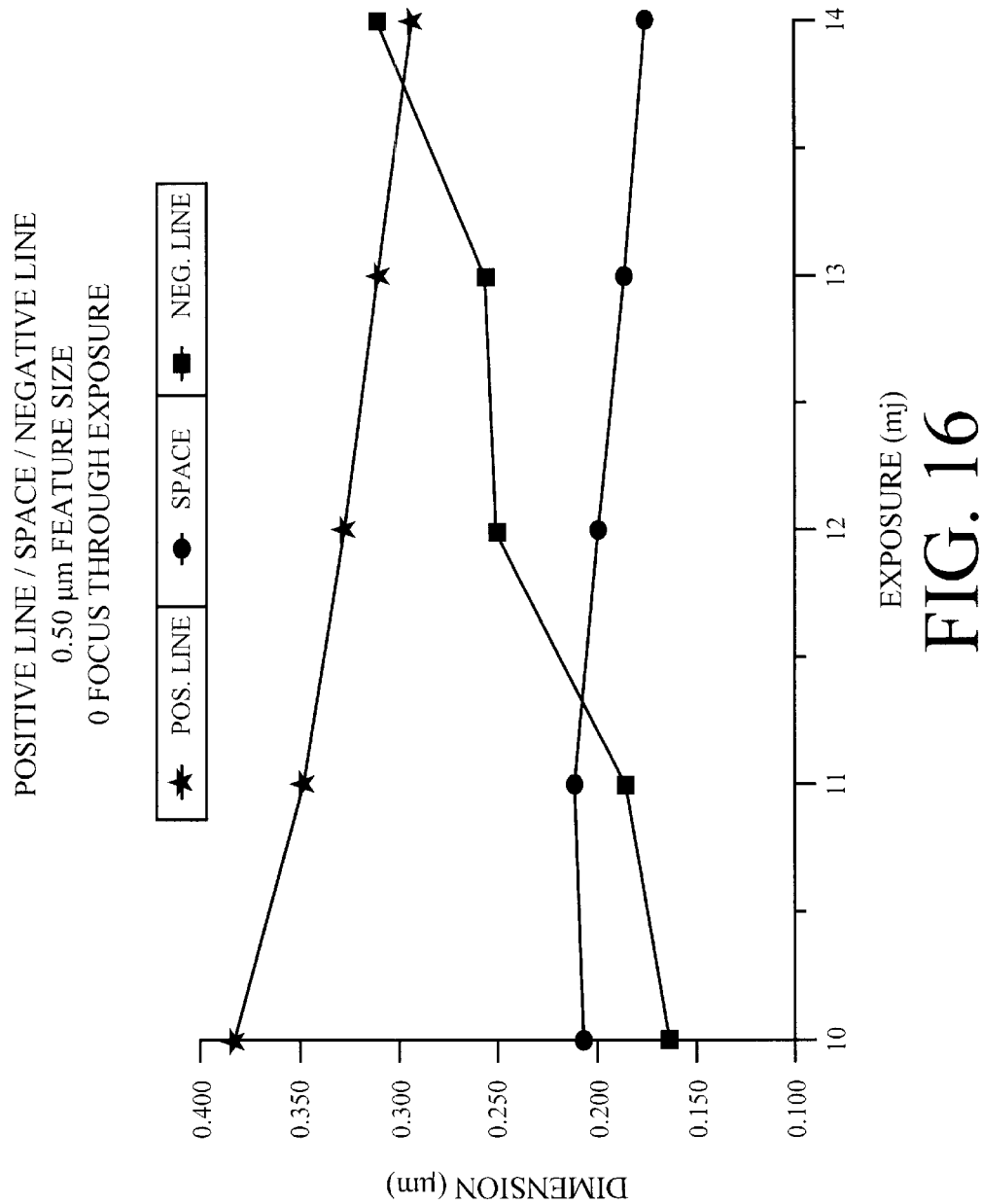
FIG. 16 is a graph of the response of a formulation of the hybrid resist of the present invention in which exposed (negative) line, unexposed (positive) line and space widths are plotted as a function of exposure dose.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of exposure dose. The space remains relatively constant in the range of about 0.18 $\mu$m, whereas both lines vary as the exposure dose is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 $\mu$m. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$) with a clear glass reticle. A post exposed bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 $\mu$m was observed for the hybrid resist relative to the standard negative resist, as calculated using standard methods known in the art.

When hybrid resist is exposed to actinic energy, areas of the resist which are subject to a full exposure form a negative tone line pattern, areas which are unexposed form a positive tone pattern, and areas which are exposed to intermediate amounts of radiation become soluble and wash away during development. Turning to FIG. 17, an exemplary mask 1700 containing a mask blocking shape 1702 is illustrated. When hybrid resist is deposited on a wafer, exposed through mask 1700 with actinic radiation, and developed, the mask 1700 creates the a "linked" or "donut" pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

FIG. 18 shows a wafer portion 1802 upon which hybrid resist has been deposited, exposed through mask 1700 containing a blocking shape 1702 and developed. Hybrid resist portions which are unexposed (i.e., the inside region 1804 blocked by mask shape 1702) remain photoactive and insoluble in the developer and form positive tone line patterns. Hybrid resist portions which are exposed with high intensity radiation (i.e., the outside region 1806 not blocked by mask shape 1702) are completely cross-linked during the post exposure bake and form a negative tone line pattern. Hybrid resist portions which are exposed with intermediate amounts of intensity (i.e., the areas under the edges of mask shape 1702) become soluble in developer solution after the first exposure and are dissolved during the development step and form space 1808 in the hybrid resist.

Because portions of the hybrid resist were unexposed during the first exposure, these regions remain photoactive and now comprise positive tone resist patterns. Thus, by blanket exposing the wafer these positive tone resist patterns are polymerized and can be washed away during development. The blanket exposure is preferably an intermediate exposure, either by exposing at a low enough dose or for a short enough to create an intermediate response to those areas of resist that were unexposed (i.e, the positive tone patterns) in the first exposure step.

In the alternative, the positive tone portions can be removed by a selective etch using a solution of pure n-butyl acetate at room temperature or with a strong base, such as 0.35 Normal (N) tetramethyl ammonium hydroxide (TMAH).

Turning to FIGS. 21, 22, and 23, the wafer portion 1802 is illustrated after a blanket exposure and development, where FIG. 22 is a cross section of the wafer portion in FIG. 21 taken along lines 22—22, and FIG. 23 is a cross section of the wafer taken along lines 23—23.

The blanket exposure has caused the positive tone regions (i.e., the hybrid resist portion 1804 (of FIGS. 18, 19 and 20)) which were unexposed (i.e., blocked by mask shape 1702) to become soluble and wash away during development.

Chromeless Phase Edge Processing In chromeless phase edge processing, a chromeless mask is used to pattern conventional positive or negative photoresist (only negative photoresist will be discussed here). The mask is made of open (not phase-shifted) portions and phase-shifted portions. Both portions allow light to pass freely, but the open portions pass all incident light, while the phase-shift portions shift the phase of the light 180 degrees. Thus, the phase-shift portions also pass all the light, only the light is phase-shifted 180 degrees out-of-phase with the light that passes through the open portions. At the transition region between open and phase-shift portions, the light undergoes destructive interference such that it exhibits lower power in the area around transition regions. This lower power causes the negative photoresist near transition regions to be relatively unexposed. Because negative photoresist becomes substantially more polymerized and harder to remove when it is exposed to radiation, the photoresist near transition regions, which is not exposed, will be removed after development.

Figure 24:
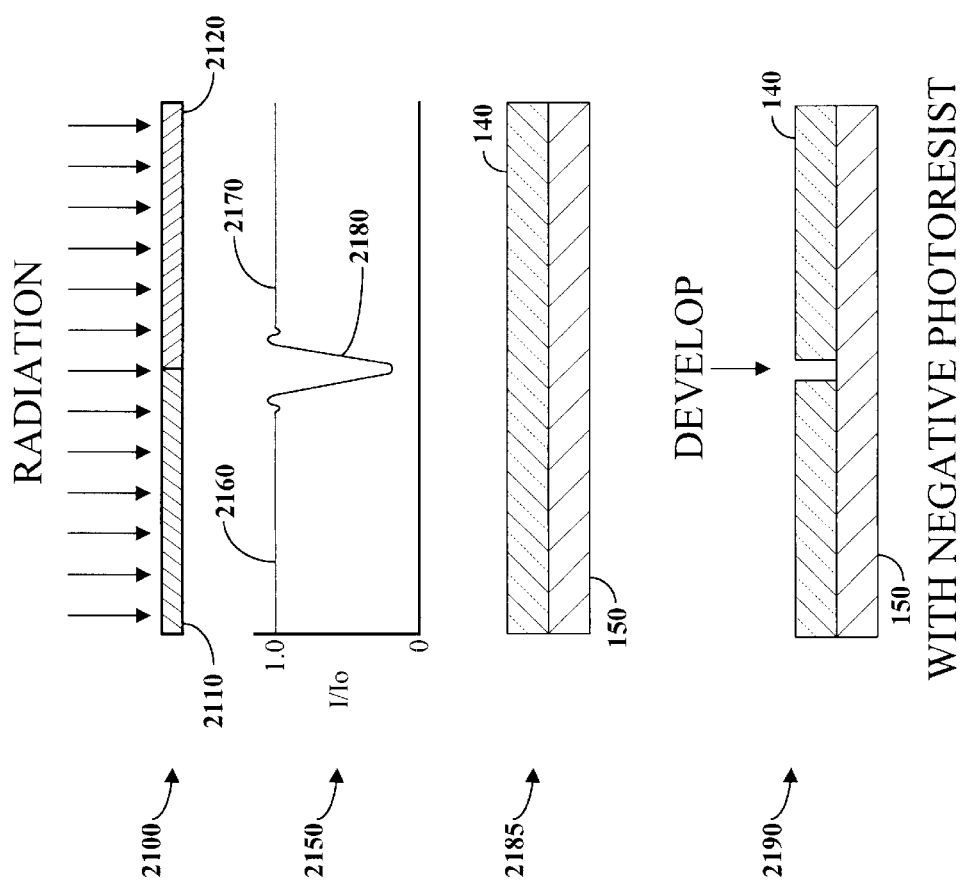
FIG. 24 is a cross-sectional view of a phase-shift mask, the resulting normalized light intensity under the mask, and the resulting pattern after develop for negative photoresist.

This is shown in FIG. 24. In FIG. 24, radiation strikes a phase-mask 2100 having an open portion 2110 and a phase-shift portion 2120. The resulting intensity of radiation is shown in intensity curve 2150. Intensity curve 2150 diagrams the intensity of radiation incident at the surface of photoresist 140 (this intensity is denoted I) as a fraction of the intensity reaching phase-mask 2100 (this intensity is denoted Io). Thus, if all of the radiation reaches the surface of photoresist 140, the fraction I/Io will be one; if none of the radiation reaches the surface of photoresist 140, the fraction I/Io will be zero. Sections 2160 and 2170 of intensity curve 2150 illustrate that all or substantially all of the radiation reaches the surface of photoresist 140 in these sections. In section 2180, however, destructive interference causes a substantial decrease in radiation intensity. This decrease in radiation intensity will deliver a smaller amount of radiation to a small sliver of negative resist, and this small amount of negative resist will be removed after develop. This is shown in developed wafer portion 2190.

General DRAM Structures

Figure 25:
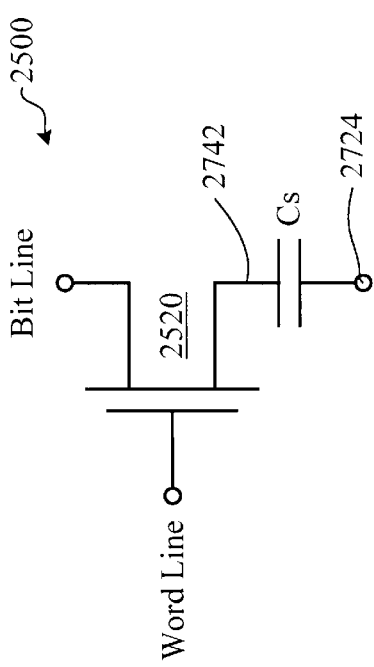
FIGS. 25–28 are examples of common Dynamic Random Access Memory structures.

A simple, single-cell DRAM structure is shown in FIG. 25. When a voltage of magnitude greater than the threshold voltage is placed on the word line, current can flow from the bit line of the Metal Oxide Semiconductor Field Effect Transistor (MOSFET) to the storage capacitor Cs (or vice versa).

Figure 26:
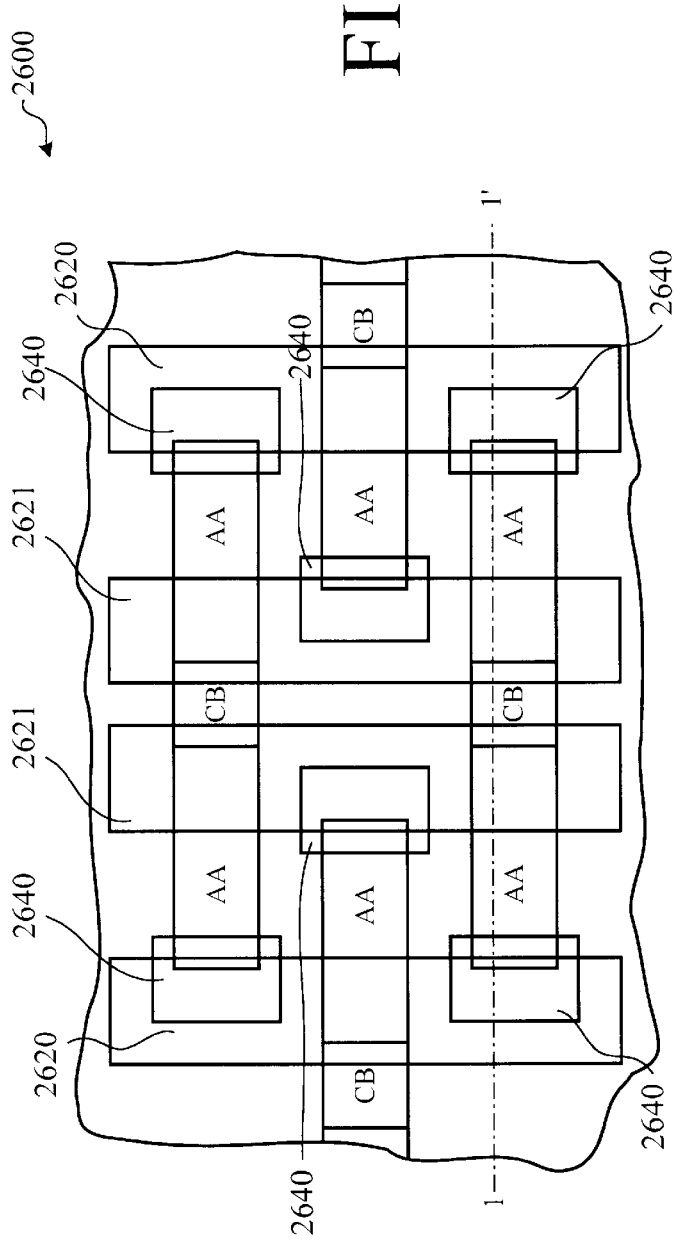

A top view of wafer portion 2600, which contains a DRAM array, is shown in FIG. 26. FIG. 26 only shows several features of the somewhat complex DRAM structure. Bit line contacts (CB) are placed above active areas (AA). Word lines 2620, 2621 cross deep trenches 2640 and intersect and cover part of the active areas to selectively enable or disable the MOSFET formed by the active areas. Deep trenches 2640 help to form storage capacitors Cs. It can be seen that there is an alternating array of active and passive areas of the array. For instance, word line 2621 crosses an active area but then crosses a deep trench area (which is inactive for this word line), and then crosses another active area.

Figure 27:
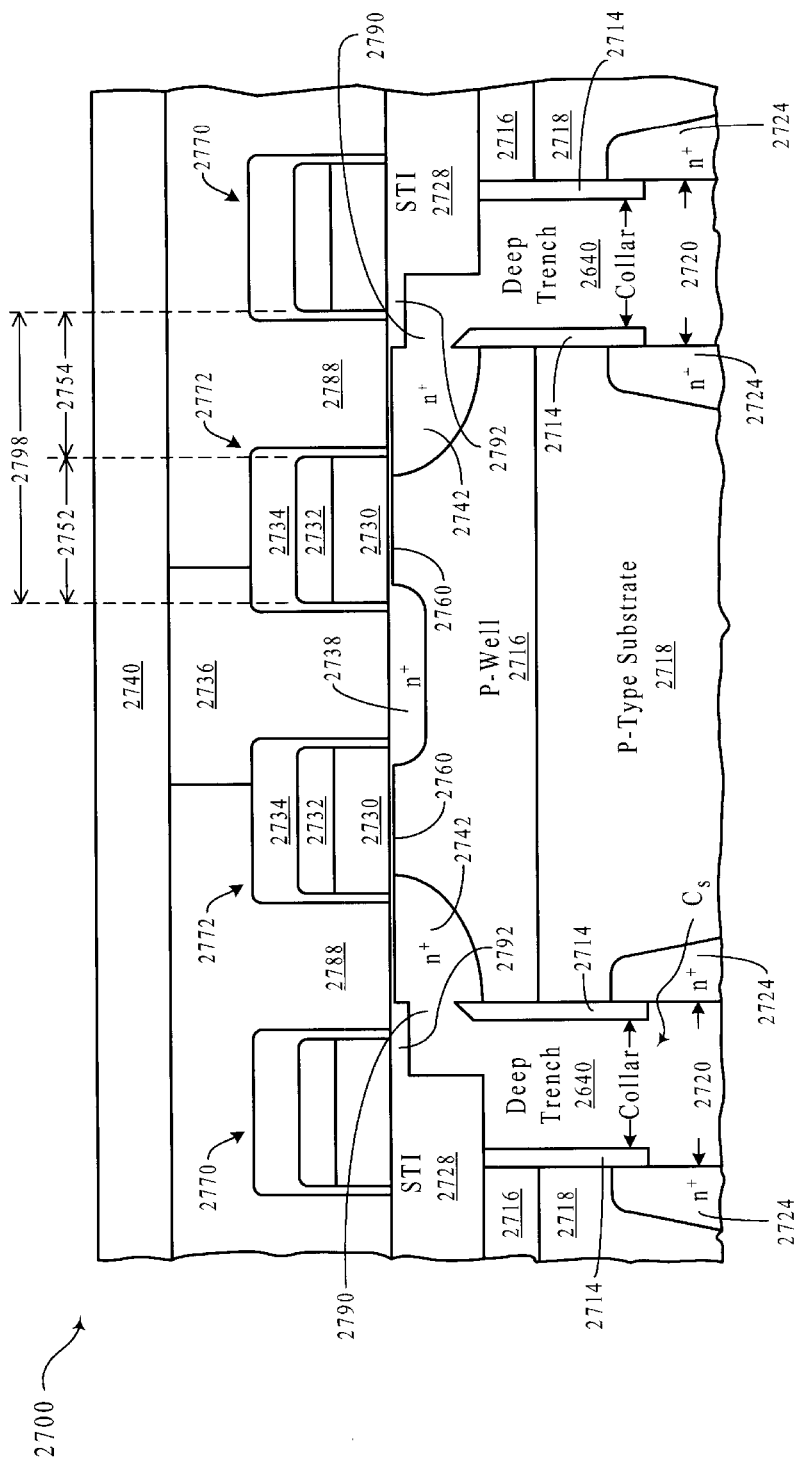

A cross-sectional view of wafer portion 2600 along cross-section 1–1' is shown in FIG. 27. Wafer portion 2700 contains several memory cells 2772 and word lines 2770 that cross to the next memory cell (not shown). Memory cells 2772 are active in this slice. Capacitor Cs of FIG. 25 is formed by strap 2742, dielectric 2720, and plate 2724.

These memory cells are formed by creating, for example, a P-well 2716 in a P-type substrate 2718. The capacitor plate 2724 is formed in the substrate 2718 by forming an N+ region 2724 in substrate 2718. A Deep Trench (DT) is etched into the substrate 2718 and the storage capacitor plate 2724 is formed by out-diffusing N+ dopant from the DT sidewalls. Node dielectric 2720 is formed and the deep trench (DT) is filled with doped polysilicon 2640. The polysilicon is recessed, and an insulating collar 2714 is formed on the top sidewall portions of the DT, which is then filled with doped polysilicon 2640. Note, the insulating collar 2714 is excluded from an upper part 2790 of one of the top DT sidewall portions in order to out-diffuse a strap 2742 from the DT polysilicon 2720.

The DT polysilicon 2640 is recessed again to expose parts of the collar 2714, which is silicon oxide for example. The exposed collar is etched and the recess is filled again with polysilicon 2640, from which the strap 2742 is out-diffused to connect the DT polysilicon 2640 to the source or drain of the transfer device 2772. The transfer device 2772 (a MOSFET) is called a transfer device because it transfers charge to and from the capacitor Cs. Shallow Trench Isolation (STI) regions 2728 cover a portion of the DT.

A source or drain region 2738 is formed in the P-well 2716 between transfer devices 2772. Illustratively, the source or drain region 2738 and strap 2742 are heavily doped N+regions in P-well 2716.

A thin layer of gate oxide 2760 separates the gate 2730 from the MOSFET channel in the P-well 2716. Gate 2730 is generally formed of polysilicon, and may be doped with either N+ or P+ impurities (which change the threshold voltage) Gate 2730 acts as the word line, (also shown in FIG. 25 as cell 2500) of the memory cell 2772. Shallow trench isolation (STI) regions 2728 are formed in the substrate and surround active regions AA (shown in FIG. 26) to isolate active cells 2772 from neighboring cells. In addition, top covers 2792 are formed to further isolate active cells 2772 from other devices. Generally, STI regions 2728, top covers 2792 and collars 2714 will be made of silicon oxide.

A gate contact or wiring layer 2732, also referred to as a gate conductor, is formed over the gate 2730. Wiring layer 2732 is usually a tungsten W or a tungsten silicide $WSi_x$ layer. The gate 2730 and gate wiring 2732 have widths that equal a minimum lithographic feature size F. This is shown as dimension 2752, which is 1.0 F. Similarly, the distance between gates is shown as dimension 2754, which is also 1.0 F. The overall dimension for one cell is shown as dimension 2798. Dimension 2798 is 2.0 F in this example.

An insulator or dielectric 2734, such as a nitride, is usually formed to cover the gate wiring 2732 and sidewalls of the gate 2730. An oxide layer 2788 is formed over memory cells 2772, 2770 and is etched selectively to the insulator 2734 to form a bit line contact opening that exposes the source and drain N+ region 2738 located furthest from the DT. The opening over the exposed N+ region 2738 is filled with a conductive material to form the bit line contact 2736. Finally, a bit-line 2740 is formed over the oxide layer 2788 to connect various bit line contacts 2736 arranged in rows of the array that is formed from many of the memory cells 2772, 2770 that are also arranged in rows and columns.

Preferred Embodiments

The preferred embodiments of the present invention provide long gates, with and without grooves, for use in memory cells. The long gate provides a long channel while allowing the actual width of the gate to increase and the density of memory cells to remain the same. Adding a groove to the gate further lengthens the channel (though not the gate) and further shields the source from the drain, and vice versa. The preferred embodiments use photolithographic image enhancement techniques to define small spaces and yet long gates. Hybrid resist or phase edge processing may be used as the image enhancement technique to form small spaces. If necessary, hard mask and spacer steps may be applied in order to provide greater process latitude and to form small spaces.

Because memory cell densities are increasing (particularly in Dynamic andom Access Memories, DRAMs), making spaces smaller generally entails using image enhancement techniques such as hybrid photoresist or phase edge processing. "Regular" photolithography tends not to produce the required linewidths that hybrid photoresist and phase edge processing can produce. Although the latter two techniques are used in the preferred embodiments of the present invention to produce long gate structures with small spaces between gates (and grooved gate structures, if these are used), any method that allows similar structures to be made in accordance with the present invention may be used. Furthermore, photolithography techniques vary wildly and the processes used in the preferred embodiments of the present invention are examples only.

The embodiments of the present invention allow long gates and small spaces to be formed in the same number of "squares" or units of F as current small-dimension memory cells. This allows the dimension of individual cells to remain the same while the gate lengths for the cells increases; this decreases leakage from the cells. Because the dimension of cells are used in the upcoming discussion of the preferred embodiments, a synopsis of dimensions used to describe structures on semiconductors will now be given.

The lithographic F unit as discussed previously is the minimum feature size for conventional photolithography. In particular, 1 F is the minimum image size that can be exposed (or unexposed) on a wafer without diffraction effects excessively degrading the image. As such, F varies with different exposure tools, different exposure wavelengths, and different resist formulations. For example, a 2× exposure tool using a chrome-on-glass reticle that can only accurately image 0.70 µm chrome shapes would have an F of 0.35 µm. The aerial image (the image on the reticle) produced by such a system will create an equivalent feature on the photoresist of the wafer. If the photoresist is positive, the feature will be a "bump" of photoresist; if the photoresist is negative, the feature will be a trough in the photoresist. Thus, the aerial image on the reticle becomes the feature on the photoresist and wafer. The 1 F feature size is chosen based on an assessment of the resolution capability of the lithographic system, which is the capability of an optical stepper, using chrome-on-glass reticles, and without off-axis illumination.

Features smaller than 1 F have been attained through image enhancement techniques, such as phase edge processing, hybrid resist processing, and off-axis illumination. These techniques, however, do not produce a feature in the same manner as conventional photoresist methods. For instance, using the conventional photoresist methods of the previous paragraph, a square of chrome (the aerial image) on the reticle will produce a "square" feature on the photoresist layer (after baking and development, and where each side of the square is greater than 1 F on the photoresist layer). Because light "bends" around the edges of the chrome square, the "square" feature on the photoresist layer will actually be somewhat round in appearance; square edges are rounded by this phenomenon. The feature on the photoresist layer is, however, similar to the feature on the reticle. Phase edge and hybrid resist processing, on the other hand, produce "loop" features around the square on the resist in addition to creating a "square" in the resist. Off-axis illumination changes the square into a different shape. Thus, the aerial image on the reticle is either a similar feature plus loops or is not the same feature produced in the photoresist for image enhancement techniques.

The embodiments of the present invention provide gates that are larger (longer) than 1.0F and spaces that are smaller than 1.0 F for a cell width of 2.0 F. Using hybrid resist, spaces of about 0.5 F and gates of about 1.5 F may be made; using negative resist and phase edge processing, spaces of about 0.7 F to 0.8 F and gates of about 1.3 F to 1.2 F, respectfully, may be made. These sizes are for a cell size of 2.0 F. In addition, using hard mask and spacer technologies can decrease the size of spaces and increase gate sizes even further while still allowing the overall cell size to remain the same.

Figure 28:
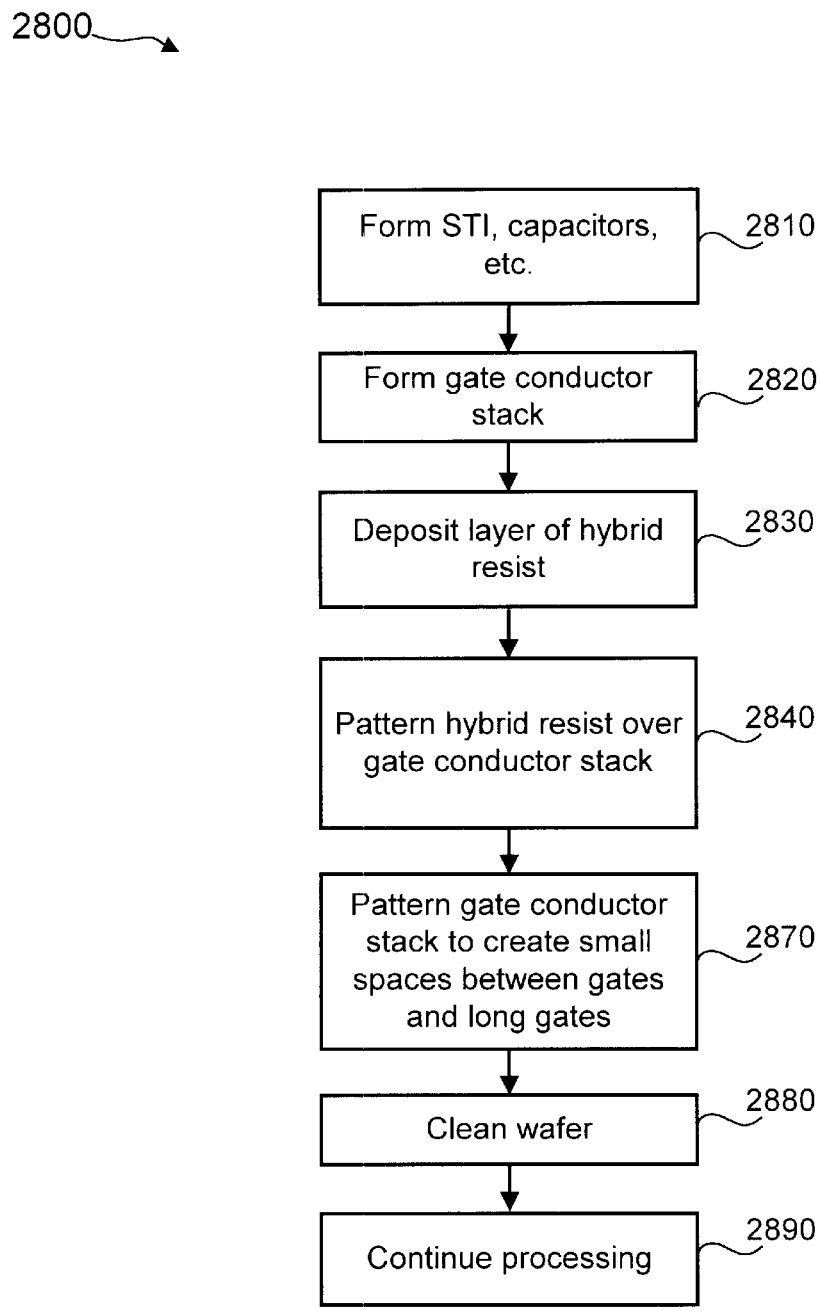

Turning now to FIG. 28, a method for forming a long channel DRAM gate using hybrid photoresist is shown. Method 2800 is used to form long gates for use in memory cells with small spaces between gates; this method may also be modified to include grooved gate structures. Method 2800 begins when the wafer is prepared in step 2810. Such a step could include cleaning, doping, diffusion, oxidation, epitaxy, etc. Generally, most of method 2800 occurs after the deep trench, collars, shallow trench isolation areas, plate areas and oxide have been formed. In addition, the gate conductor stack (for example, polysilicon covered with a film of tungsten silicide followed with a cap of Tetra-Ethyl-Ortho-Silicate (TEOS) oxide) is usually deposited in step 2820. Thus, the majority of a DRAM structure, including the gate conductor stack has been formed.

Hybrid resist is then applied to the surface of the wafer in step 2830; this hybrid resist may be any suitable formulation. Generally, the resist is spin-applied to a certain thickness, which for this example is 0.45 micrometer (µm). The wafer is then exposed to radiation in step 2840. For example, a deep ultraviolet (DUV) projection aligner with a 248 nanometer (nm) exposure wavelength and an 0.6 numerical aperture (NA) lens system will adequately expose most hybrid resists. The resist-covered wafer is then generally baked to cross-link and "harden" the exposed portions of the resist. For instance, baking the wafer at 100 degrees Centigrade for 90 seconds is generally sufficient for most hybrid resists. If the resist is of a formulation that need not be baked or if additional processing steps will be used (such as a second exposure on parts of the wafer), then baking can be delayed or not performed.

Once the resist has been exposed, portions of the resist will have been exposed to higher power light (the "negative tone" portion), portions will have been exposed to a intermediate power light, and portions will not have been exposed (the "positive tone" portion). As explained previously, the portions exposed to an intermediate amount of light will be more soluble than those portions not exposed or exposed to high power radiation. These more soluble portions will be removed in the development step. Baking in step 2840 helps to complete the cross-linking of the structures in the resist to make the negative tone of the hybrid resist insoluble while not affecting the positive tone of the resist. After baking, the negative tone areas should be insoluble to developer and should not be removed during the etch step.

Development, and removal of that portion of hybrid resist exposed to intermediate radiation, is also performed in step 2840 of method 2800. For example, development of most hybrid resists may be accomplished by dipping the wafers in 0.14 Normal (N) tetra-methyl-ammonium hydroxide (TMAH) developer. The removed resist creates a depression or space where the removed resist was.

Prior to etching the wafer, it is possible to decrease the size of the spaces created by the removed resist. Hard mask and spacer technology may be used for this purpose. This could yield spaces that are smaller than those definable by using hybrid resist alone. This will further decrease the sizes between gates while increasing the size of the gates and yet keeping the overall pitch the same. This will be discussed in more detail in reference to FIG. 38.

Figure 29:
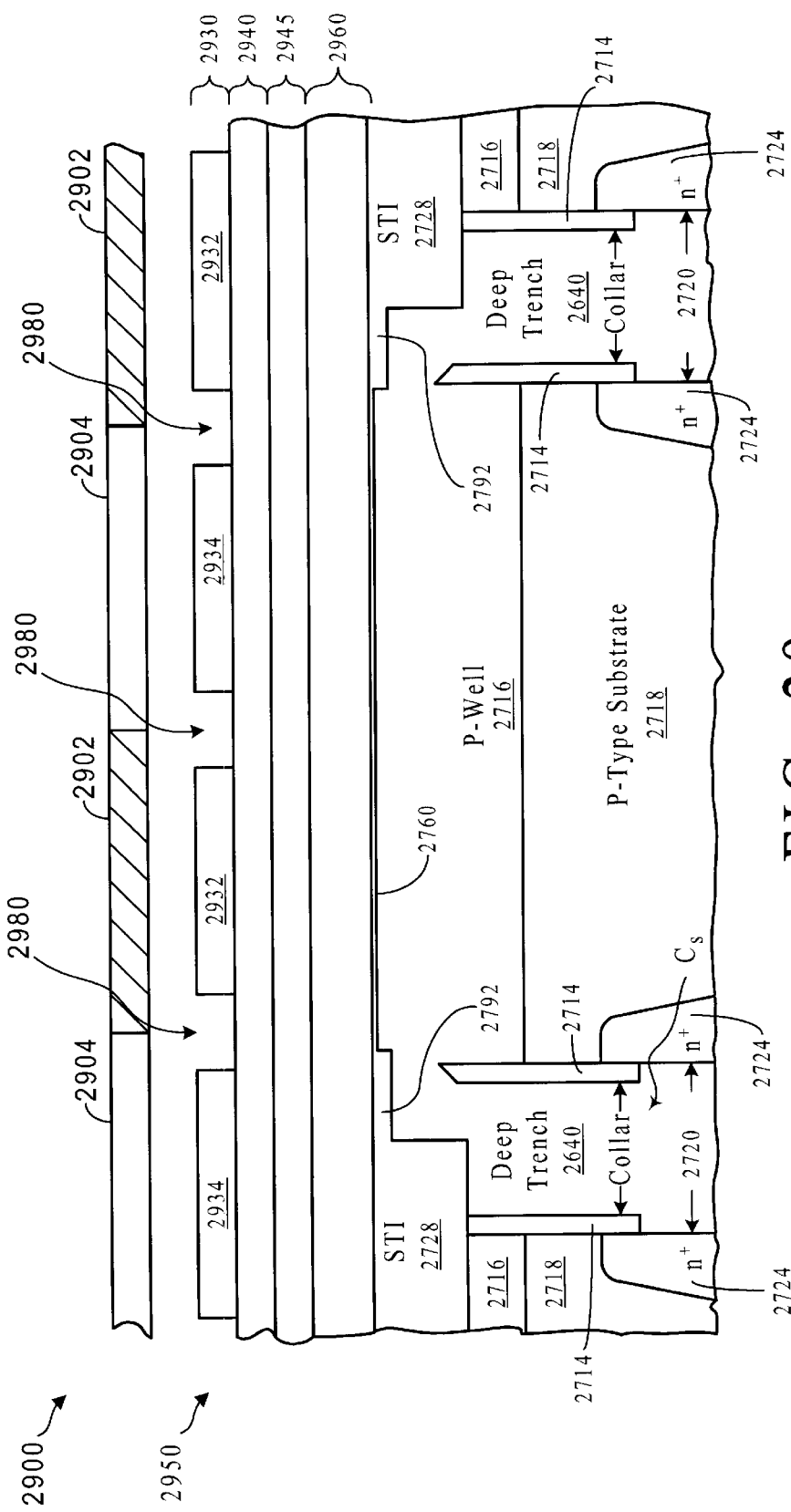
FIGS. 29–33 are cross-sectional side views of a semiconductor wafer during hybrid photoresist and chromed mask processing in accordance with preferred embodiments of the present invention.

Turning now to FIG. 29, examples of a mask 2900 and a wafer portion 2950 are shown. Wafer portion 2950 is shown after a high power exposure, bake, and develop, whereas mask 2900 is shown in this figure for reference purposes. Mask 2900 has clear portions 2904 and chromed portions 2902. Chromed portions 2902 block all incident radiation (not shown), while clear portions 2904 allow incident radiation to pass. Wafer portion 2950 is a processed wafer portion having a hybrid resist layer 2930, an insulating layer 2940, a wiring or gate contact layer 2945, and a gate conductor layer 2960. Hybrid resist layer 2930 has been divided into negative tone portions 2934 (which have been exposed to radiation), spaces 2980, and positive tone portions 2932 (which have not been exposed to radiation). The intermediate exposed regions have been removed to create spaces 2980. FIG. 29, then, is a "snapshot" of a wafer portion taken after step 2840 of method 2800.

Spaces 2980 are similar to "moats" in the sense that wherever chromed portions are on the mask, there will be a small space surrounding the chromed portions on the wafer after develop. Spaces 2980 are illustrated as being exactly in the center of the line dividing chromed portion 2902 and clear portion 2904. In reality, there will probably be some skew away from chromed portion 2908. This skew will generally cause spaces 2980 to be acentric as compared to the edges of chromed portions 2902. However, the amount of skew depends on the process being used, and FIG. 29 and further figures will illustrate spaces 2980 as being centered under each edge of a chromed portion for simplicity.

Returning to FIG. 28, patterning the gate stack is the next step, step 2870. The etching process forms spaces or depressions where material is removed. The hybrid resist protects areas where it is preferred that etching does not remove material. Thus, etching is a selective process that creates depressions in areas where there is no resist.

Once etching is complete, the wafer is cleaned in step 2880. Cleaning generally involves growing a sacrificial oxide and removing the oxide, resist, and contaminants with a buffered hydrogen flouride (BHF) dip.

Figure 30:
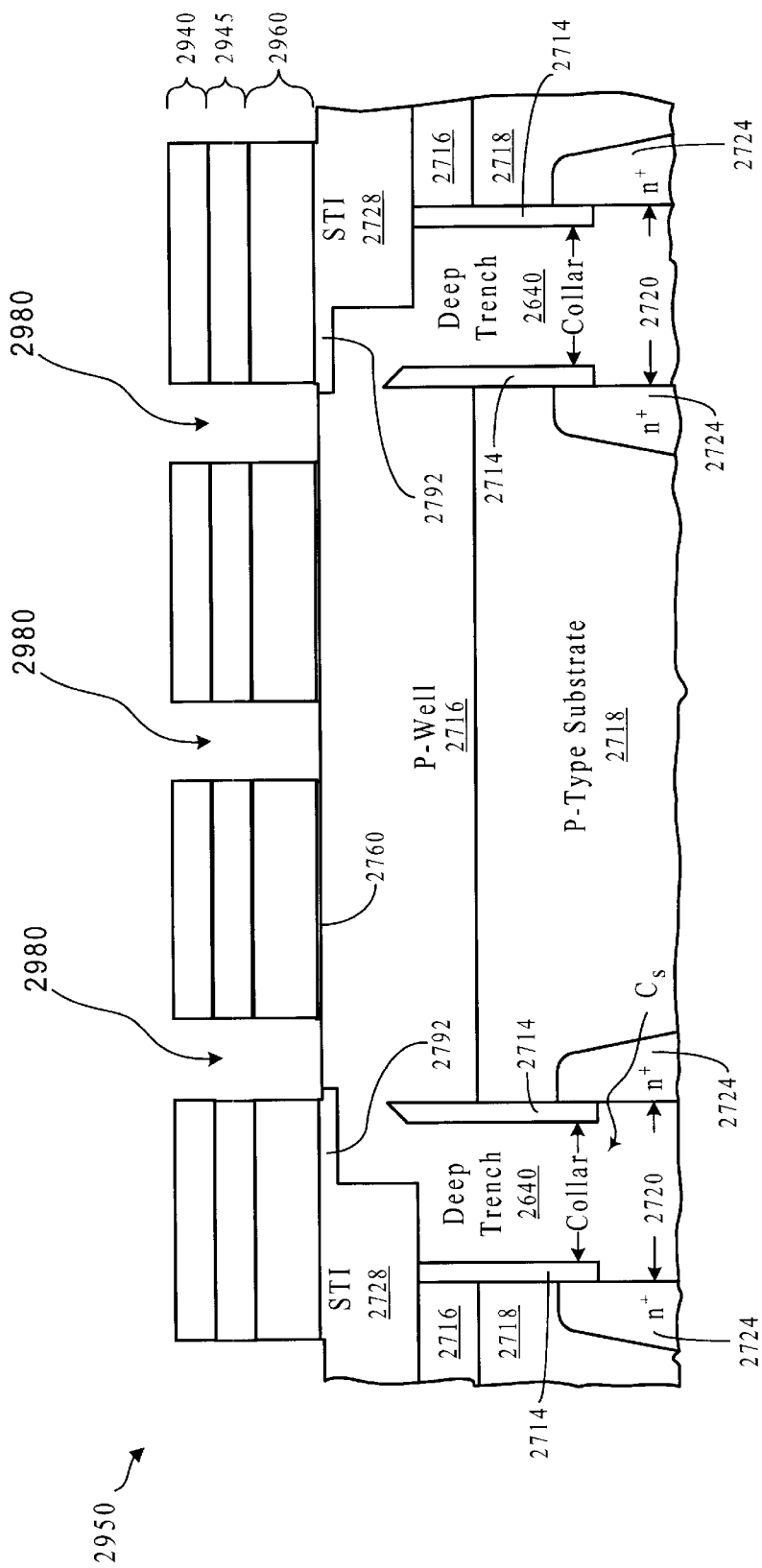

Turning now to FIG. 30, FIG. 30 shows wafer portion 2950 after etch and cleaning. Space 2980 now extends down through insulating layer 2940, wiring or gate contact layer 2945, and gate conductor layer 2960. In addition, oxide layer 2760 may also be removed such that spaces 2980 may slightly enter P-well 2716. Wafer portion 2950 would result after step 2880 in method 2800.

Returning to FIG. 28, other processing steps to complete the DRAM are taken in step 2890. For instance, an oxide will usually be formed and bit lines will be deposited. This step contains all steps necessary to complete the memory cells and chip.

Figure 31:
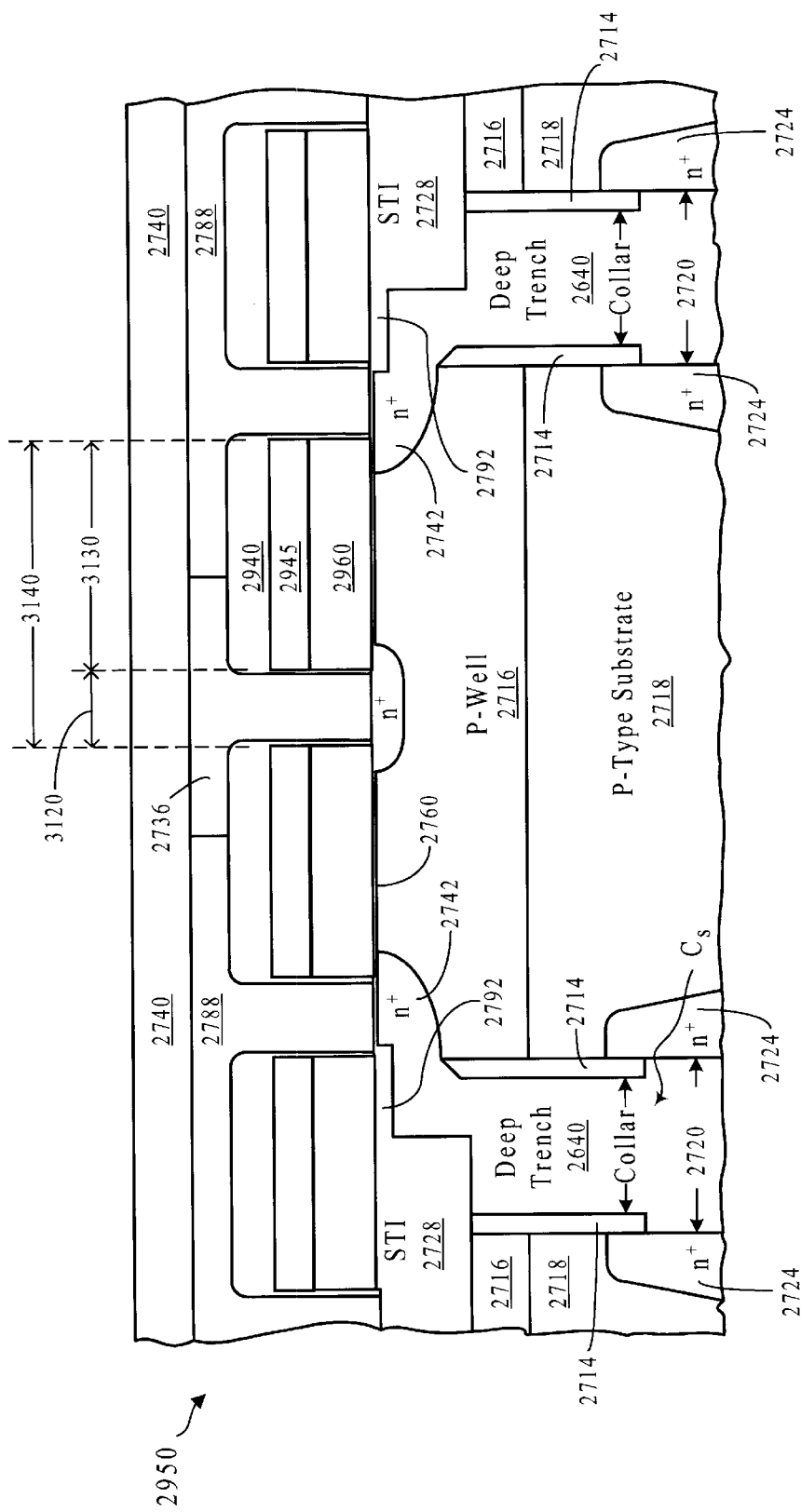

Referring now to FIG. 31, one possible final version of a DRAM array is shown. Wafer 2950 now has many necessary structures such as bit line contact 2736, bit line 2740 and oxide layer 2788 added to enable data to be written into and read out of strap 2742.

FIG. 31 shows that dimension 3120, which indicates the size of space between gate conductors, is small while dimension 3130, which indicates the size of the gate, is large. Pitch 3140 generally will not change from previous DRAM devices. For instance, as shown in FIG. 27, the normal pitch 2798 is 2.0 F, which comprises dimension 2752 (the width of a gate conductor or gate) at 1.0 F and dimension 2754 (the width of the space between gates). For some embodiments of the present invention, dimension 3120 (the width of the space between gates) will be about 0.5 F, while the width of the gate conductor (dimension 3130) will be about 1.5 F. Thus, the pitch 3140 remains at 2.0 F but the gate conductor width has increased. The gate in these embodiments will have a width that will be at least twice the size of the space. It must be noted that exact dimensions will vary from this example somewhat because of the process used and variances within the process. In other embodiments, the space will be larger. For instance, phase edge processing will generally produce slightly larger spaces, on the order of about 0.7 F, which means that the gate will be about 1.3 F. As previously explained, longer gates reduce leakage and improve storage times and bit error rates.

For an even better reduction in leakage, grooves may be added to the gates produced by embodiments of the present invention. Adding grooves to the gates will decrease leakage and further increase bit error rates and storage times. In addition, using embodiments of the present invention with grooves allow the grooves to be more easily aligned to the gates; this allows greater process latitude. Grooves extend the effective channel length and help shield the source from the drain. Both of these benefits tend to decrease leakage.

Grooved gate structures are discussed in detail in application BU9-97-107, "DRAM Cell with Grooved Transfer Device," Furukawa et al. Grooves used with the present invention may be formed by any of the methods disclosed in BU9-97-107. Combining the longer gates and shorter spaces of the present invention allow gates to be aligned more easily to the grooves. Shorter gate conductors make it harder, on the other hand, to align the gate conductor stack to the groove. If the groove is 0.5 F wide, for instance, a 1.0 F gate only need be slightly larger than an 0.25 F distance off of the center of the groove for errors to occur. Any distances larger than 0.25 F from center will result in a gate conductor that does not completely cover the groove; this will generally result in shorts or other defects. Longer gates made in accordance with embodiments of the present invention allow higher processing tolerances and still allow grooves to be covered by gates.

Concerning processing tolerances, the amount of deviation from ideal for a manufacturing process is usually expressed in terms of sigma. Sigma is a unit of standard deviation, which is a measure of how much the real-world process differs from the ideal process. In manufacturing processes, there will always be some skew from the ideal. For instance, in semiconductor manufacturing, mask overlay errors or lithographic image size errors can cause deviations from the ideal, designed pattern formation. These slight errors then cause other errors, which may result in bad semiconductor chips. Either some or all of the chips on one wafer may not function correctly. These lost chips can be very expensive to a semiconductor manufacturer. Most manufacturers require 3 sigma or even 6 sigma processes for the invention to be profitable. Assuming a Gaussian (or normal) distribution, this would require a realization of 99.7% (0.3% errors) or 99.99%, respectively. Because gate conductor width is increased with embodiments of the present invention, using the present invention with grooved gate structures increases yields.

For most lithographic processes, a general rule is that the combined image size and overlay tolerances should be equal to approximately 0.5 F in order to achieve a 3 sigma process. Thus, for the example discussed above, one would need a tolerance of 0.5 F in the positional shift of the edge of the gate conductor relative to the groove before a fail would occur. With a 1 F gate conductor, the tolerance is only 0.25 F. By increasing the width of the gate conductor to 1.5 F, this tolerance can be increased to 0.5 F, which is compatible with a 3 sigma process.

Grooves may be added to the present invention by forming the grooves prior to forming the gate conductor stack. In this manner, the gate oxide will be completely under the grooved gate and will cover all sides of the groove. Thus, in step 2810 of method 2800 grooves may be formed. Forming grooves and gate conductor stacks are covered in the previously-mentioned patent application. Once the grooves and gate conductor stack are formed, the other steps of method 2800 (step 2830, etc.) may be performed.

Figure 32:
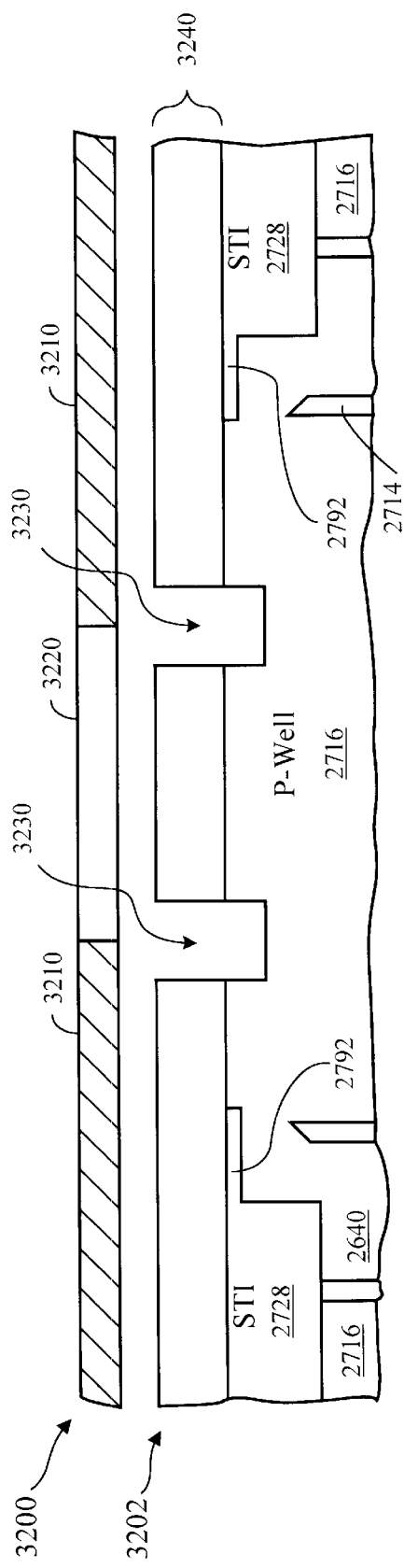

FIG. 32 shows an example of patterning a wafer to form grooved gate structures. Mask 3200, shown for relative sideways placement and location, has chromed areas 3210 and a clear area 3220. Wafer portion 3202 is shown immediately after hybrid resist layer 3240 has been added, exposed to high intensity light, baked, and developed, and wafer portion 3202 has been etched. Again, these steps are performed in step 2810 of method 2800. Opening or space 3230 has been etched into P-well 2716. The resist will be stripped, leaving the substrate with the groove formed into its surface. The gate oxide will be deposited or grown, and the gate conductor stack formed as in step 2820 of method 2800.

Figure 33:
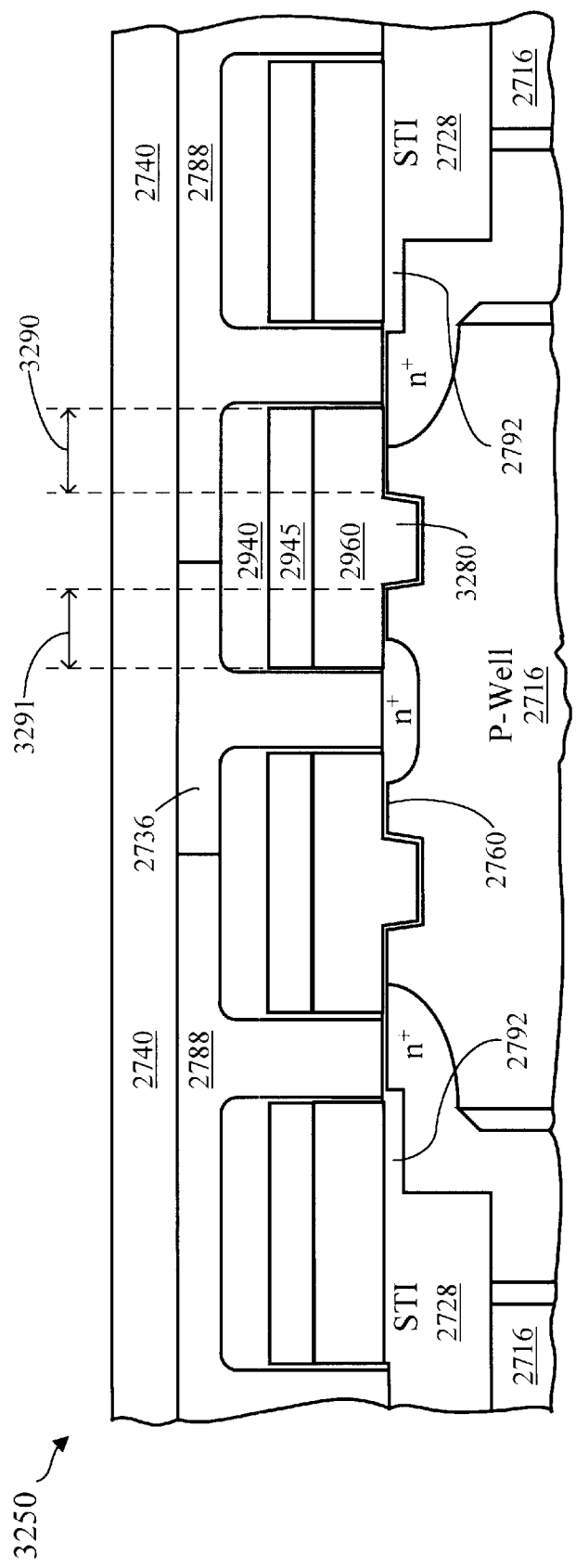

Once the entire gate conductor stack, and bit lines have been deposited, the DRAM array should be similar to wafer 3250 of FIG. 33. Groove 3280 in FIG. 33 has been formed under gate conductor 2960 to effectively become part of gate conductor 2960 after the gate conductor has been deposited. Dimensions 3290, 3291 are overlap dimensions. Overlap dimension 3291 is the distance that the gate conductor can be "moved" (deposited) toward the right before the gate conductor will fail to completely cover groove 3280. Similarly, overlap dimension 3290 is that distance for which gate conductor 2960 can be moved toward the left and still completely cover groove 3280. Any further movement in either direction will not allow the gate conductor to cover the groove, which will cause some type of defect. For instance, electrical shorts between the gate and a contact may occur, or the gap between the gate conductor and the edge of the groove may be undesirably etched, which would etch the groove filler material or the groove conductive material.

Referring now to FIGS. 34 and 35, top views of a wafer are shown. These figures illustrate removal of resist in the support area so that the ends of the "loops" caused by hybrid resist processing may be removed. FIG. 34 is a snapshot of the wafer taken just after step 2840 of method 2800, where the hybrid resist was patterned. The resist after exposure but before baking will have high exposure areas, low exposure areas, and intermediate exposure areas. The shading in the figure indicates the exposure level. Wafer portion 3300 has unexposed (positive tone) portions 3340, high energy exposed (negative tone) portions 3330, and intermediate energy exposed portions 3350. In this example, a mask equivalent in shape to unexposed portions 3340 will create the shapes shown in FIG. 34. The array 3310 is shown as a series of alternating lines of high energy exposed and unexposed areas that will later become gates after intermediate energy exposed portions are removed in step 2860 of method 2800 (in this example, the gate areas are shown as different widths; normally, the same width gate structures will be used). Support area 3320 shows a gate conductor in the supports that will later be used for timing circuits, sense amps, etc.

After baking (if baking is needed), it is preferred that the unexposed regions in support area 3320 be removed. A second expose is preferably performed that uses a reticle that is dark in the array and open in the supports. This exposure is performed using at least an intermediate energy light source. The previously unexposed portions 3340 will now be exposed with at least an intermediate energy, and these areas will become soluble to developer. The high energy exposed areas 3330 will not be affected by this second exposure. A second post-expose bake is generally not performed. The end result is shown in FIG. 35 (shown after develop), where non-blanket exposed area 3360 has prevented unexposed portions 3340 from being exposed and blanket expose area 3370 has exposed unexposed portions 3340 to create large areas of intermediate energy exposed areas 3350. This blanket exposure, thus, could be a step between steps 2840 and 2860 of method 2800. All intermediate energy exposed areas of resist are subsequently removed in step 2860 of method 2800. Other methods known to those skilled in the art may also be used to remove hybrid resist from the support areas.

What has been described thus far is one preferred embodiment to create a long gate DRAM structure, with or without grooved gates, that uses hybrid resist processing. Similarly, other image enhancement techniques may be used to create the same structures. In particular, phase mask processing may be used to make long gates and small spaces between gates, or grooved gate structures along with long gates and small spaces.

Figure 36:
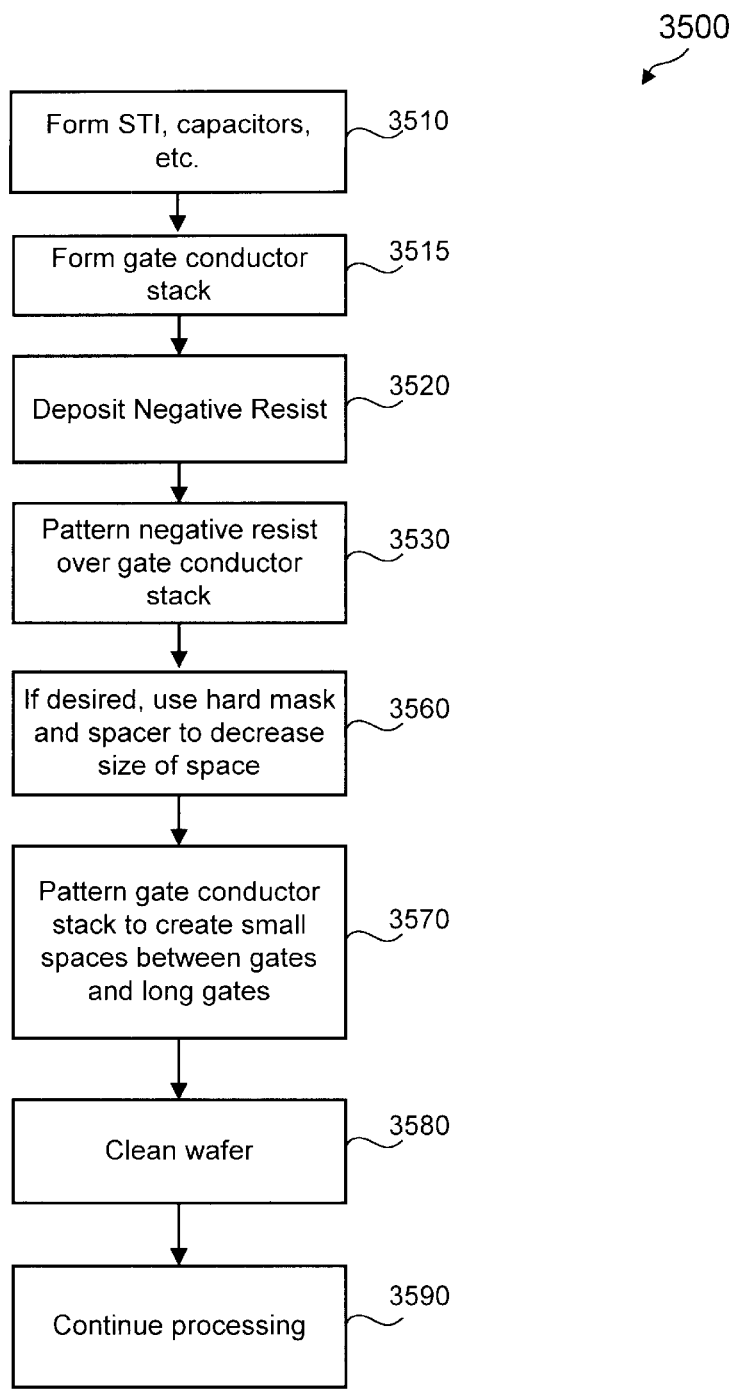
FIG. 36 is a method of making gates with negative photoresist and phase-change masks in accordance with preferred embodiments of the present invention.

Referring now to FIG. 36, a method 3500 for creating long gates, with or without grooves, using phase edge processing is shown. Method 3500 is very similar to method 2800, so only the major differences will be discussed here. One distinct difference is the use of negative resist, instead of hybrid resist, in most processing steps. Because phase edge processing generally does not make spaces that are as small as equivalent spaces made by hybrid resist processing, it may be beneficial to use hard mask and spacer technology to decrease the size of the space that is made in the resist. This space will then become the small space between gate conductors once etching is performed. Hard mask and spacer technology may also be used to make grooves for grooved gate structures, if these structures are desired. Having a smaller groove will allow easier alignment of the gate to the groove and, thus, will allow greater process latitude.

The other major difference between method 3500 and method 2800 is that a blanket expose is generally not used in the support areas. Instead, a trim mask is used to remove unwanted trenches at the end of the array. This will be discussed in more detail in reference to FIGS. 39 and 40.

In method 3500 of FIG. 36, after the negative resist has been deposited and patterned in steps 3520 and 3530, the smaller spaces between gates may be etched directly (immediately, without further processing) in step 3570, or hard mask and spacer technology (step 3560) may be used to decrease the size of the spaces prior to etching the entire gate conductor stack. There are several ways of using hard mask and spacer technology to decrease the size of spaces between the gates; two of the most preferred will be discussed below.

Figure 37:
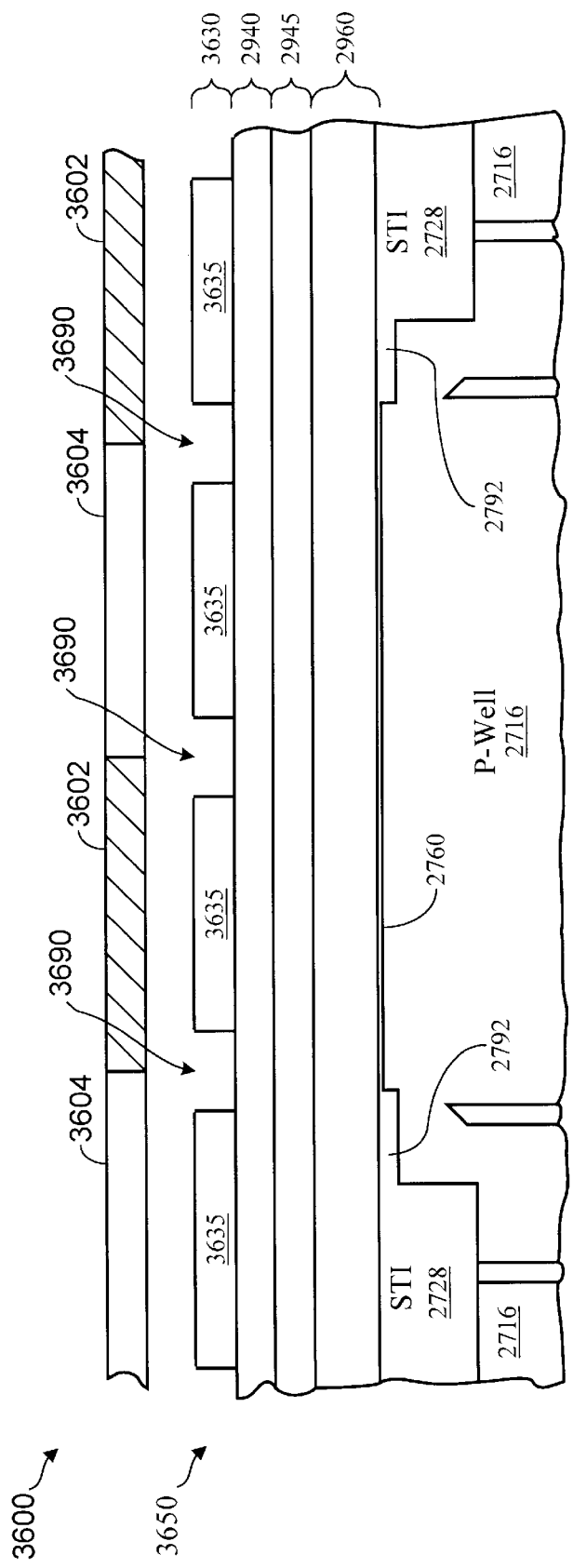
FIGS. 37–38 are cross-sectional side views of a semiconductor wafer during negative photoresist and phase-change mask processing in accordance with preferred embodiments of the present invention.

Turning now to FIG. 37, a wafer is shown after negative resist has been applied and patterned (after step 3530 of method 3500). In FIG. 37, a phase edge mask 3600 and a wafer portion 3650 are shown. Phase edge mask has open (not phase-shifted) portions 3604 and phase shift portions 3602. Open portions 3604 do not interfere with incident radiation, while phase shift portions 3602 shift the phase of the incident light 180 degrees. As explained in the background, this causes destructive interference in the area near the junction of the two mask portions. This destructive interference causes a lower light intensity in this area, which does not cause the negative photoresist to cross-link and become insoluble to developer. Thus, after baking (which helps the negative photoresist to become cross-linked) and develop, the areas exposed to this lower intensity radiation will be removed.

Wafer portion 3650 shows this removal and exposure process. Wafer portion 3650 is a snapshot of a wafer after step 3530 of method 3500. Negative resist layer 3630 has high energy exposed portions 3635 and spaces 3690, which were exposed to lower energy radiation and subsequently removed during develop.

If hard mask and spacer technology are not used at this point to decrease the size of spaces 3690, then the steps of method 3500 are very similar to the steps of method 2800. See the figures related to method 2800 for further visual representation of the major steps involved with creating long gate conductors and grooved gates. If spacer technology will be used to decrease the size of spaces 3690 (which then will decrease the width of the spaces between gates after etching), a picture similar to that shown in FIG. 38 will be achieved.

Figure 38:
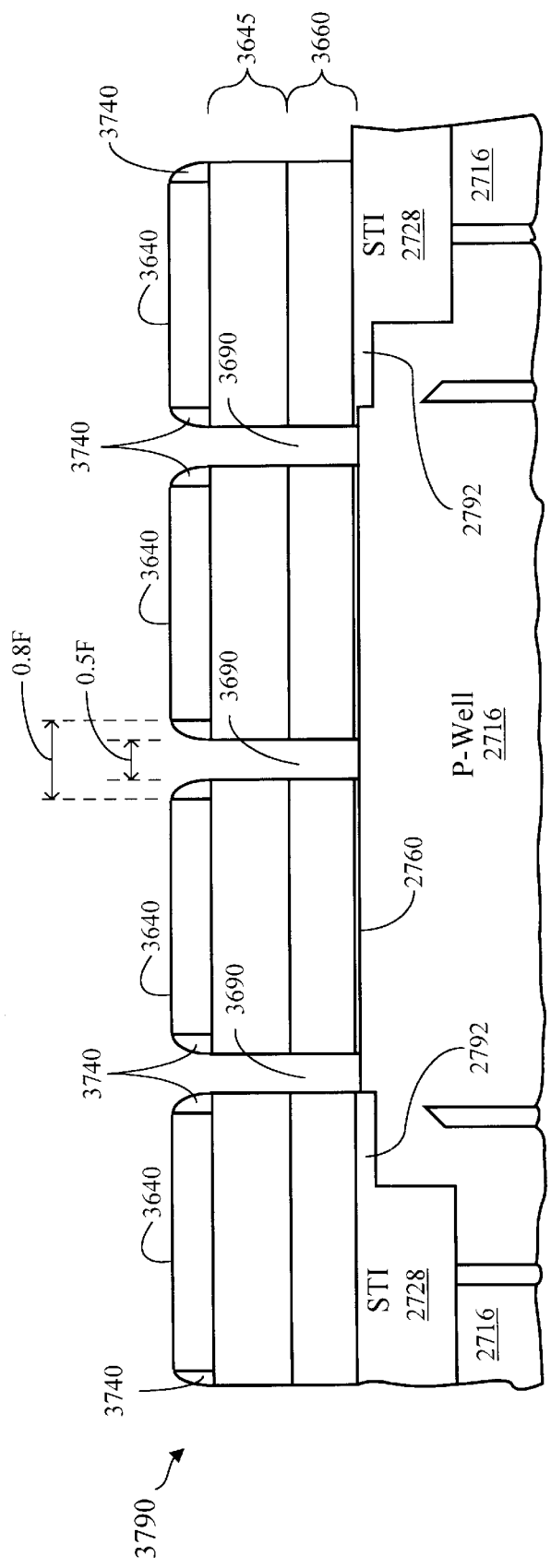

FIG. 38 shows a preferred method of using spacers to reduce the size of spaces 3690. A negative resist layer (not shown) is patterned and developed, the wafer is etched to create the 0.8 F spaces shown in insulating layer 3640 (corresponding to step 3530 of method 3500). At this point, the preferred method of using spacers to reduce the size of spaces begins by performing step 3560. In step 3560, the negative resist layer is removed. Sidewall spacers 3740 are then added to insulating layer 3640 by forming a layer second film (which is generally a dielectric) over the insulating layer 3640 and then directionally etching this second film. The directional etching (which is usually a reactive ion etch) removes the film from horizontal surfaces, leaving the spacers 3740 on vertical surfaces shown in FIG. 38. The thickness of the second film is generally determined by the reduction in the space desired. For instance, if there are 0.8 F spaces and 0.4 F spaces are desired, then 0.2 F would be the thickness of the second film that would be formed. The two spacers on both sidewalls of the space will reduce the space by 0.2 F (the first spacer) and another 0.2 F (the second spacer), for a total of 0.4 F reduction in the space's width. After the spacers have been formed, the wiring or gate contact layer 3645 and gate conductor layer 3660 are etched to create spaces 3690. Spacers 3740 are then removed, if desired, and further processing is performed to complete the DRAM structures (for instance, more insulating material may be deposited, the word lines deposited, etc.) This method may also be used to decrease the size of spaces made with the hybrid resist method 2800 of FIG. 28. In addition, any method known to those skilled in the art may be used to decrease the sizes of spaces for the preferred methods of the present invention.

Figure 40:
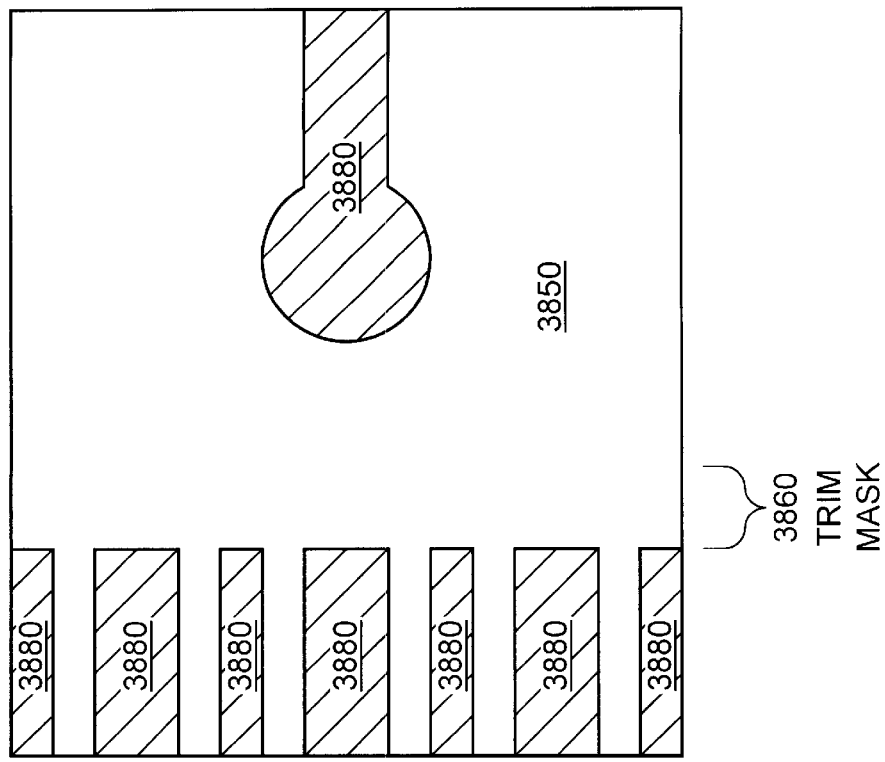
FIGS. 39 and 40 are top views of pre- and post-trim mask exposure of a wafer in accordance with a preferred embodiment of the present invention.
Figure 39:
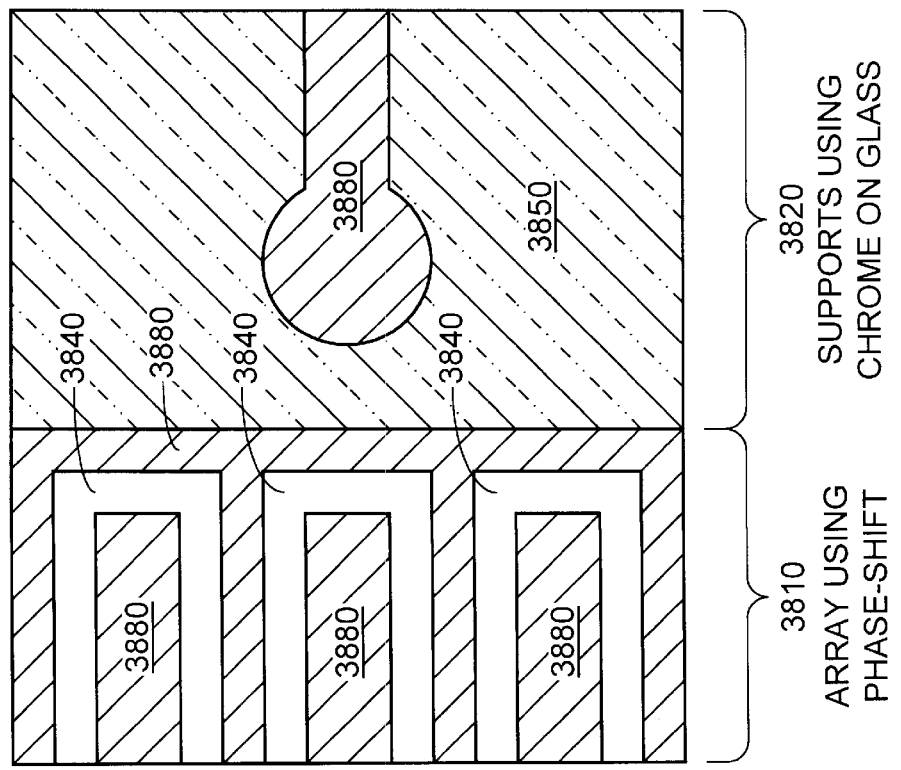

Finally, FIGS. 39 and 40 illustrate top views of wafers after exposures. These figures illustrate cutting off the ends of the "loops" caused by phase edge processing. FIG. 39 shows wafer portion 3800 after exposure to high intensity radiation. High intensity exposed areas 3880 are next to lower intensity exposed areas 3840 in array 3810. In this example, a chromed portion of the mask has been added to create unexposed portions 3850 in supports 3820. Unexposed portions 3850 and lower intensity exposed areas 3840 will be removed in subsequent develop steps. To remove the portions of high intensity exposed area 3880 that are at the end of array 3810, a trim mask 3860 may be used. The result of using a trim mask to remove the loops is shown in FIG. 40, and the process to use the trim mask is described below.

The trim mask steps are generally performed after the gate conductor cap, such as oxide, has been deposited or grown. The gate conductor cap acts as a hard mask. Resist is then applied, exposed, developed, and used as a mask (trim mask 3860) to etch the oxide exposed in the trim areas. Then the trim resist is stripped, and the etched oxide pattern is used to mask the etch of the conductive layers in the gate conductor stack. This process is preferable because it minimizes the amount of etching that would be done on the gate oxide over the diffusion areas. If the phase pattern was initially etched through the entire gate conductor stack, then the trim etch would be impinging on portions of the gate oxide throughout the entire etch of the gate stack, and the selectivities might not be sufficient. Also, there would be more topography during the expose of the trim mask if the entire gate stack had been etched at the phase mask resist layer, which would make it more difficult to print the trim portion while maintaining image size control and avoiding residual resist in the deep topography areas.

Thus, while the trimming step may be performed after completely etching the gate stack, it is preferred that the pattern for the gate stack etch be applied as in steps 3520 to 3560 of method 3500, the insulating layer etched (step 3570 of method 3500), the negative resist (and, if used, spacers) stripped, and then a fresh layer of resist applied (positive or negative) that is patterned to uncover or reveal trim mask area 3860 after the resist has been exposed, baked and developed. Then the trim mask area 3860 can be etched to remove the loops, the resist layer removed, and the gate conductor stack etched by using the "mask" created by the previous etch (step 3570) of the insulating layer. FIGS. 39 and 40 illustrate this process. Trim mask area 3860, therefore, allows the loops at the end of the array to be removed.

In addition to hybrid resist and phase edge processing, other techniques may be used to make small spaces between gates. For instance, it is possible to make a mandrel along the sidewall of an etched image. The mandrel could be made from oxide or nitride. This mandrel or spacer could be very thin, as thin as one can make a spacer. The gap between the spacers can then be filled with another material such as polysilicon. The mandrel can be removed by wet or dry etching to create a small space. Unfortunately, this type of processing is currently very complex and expensive, and thus is not preferred. In addition, regular resist and photolithographic processes, combined with hard mask and spacer technology, may be used to etch smaller spaces and create longer gates for the same pitch size.

Thus, the preferred embodiments capitalize on the unique properties of hybrid resist and phase edge processing to form long gates and small spaces between gates. This allows the pitch to remain the same while making the gates longer. The preferred embodiment creates cells that have less leakage and yet are physically the same size. Adding grooved gates to this structure will decrease leakage effects. While the invention has been particularly shown and described with reference to exemplary embodiments using hybrid resist and phase edge processing to form long gates, those skilled in the art will recognize that the preferred embodiment can be applied to other applications where reduction in leakage and increases in gate size without increasing the total pitch is needed, and that various changes in form and details may be made therein without departing from the spirit and scope of the invention.

We claim:

1. A method for forming a transistor in a memory device, the method comprising the steps of:
   a) forming a gate stack layer on a substrate;
   b) patterning the gate stack layer to simultaneously define a gate and two spaces from a single image, with the gate situated between the two spaces to form a space/line/space combination, the gate and one of the two spaces having a total width that is approximately 2.0 F, wherein the gate has a width that is at least twice a width of the one space; and
   c) forming first and second source/drain regions in the substrate on opposite sides of the gate.

2. The method of claim 1 wherein the gate stack layer further comprises an insulating layer and wherein the step of patterning the gate stack layer to simultaneously define a gate and two spaces from a single image, with the gate situated between the two spaces, the gate and one of the two spaces having a total width that is approximately 2.0 F, wherein the gate has a width that is at least twice a width of the one space, further comprises the step of forming sidewall spacers on the insulating layer to reduce widths of the two spaces, with the gate situated between the two spaces, the gate and one of the two spaces having a total width that is approximately 2.0 F, wherein the gate has a width that is at least twice a width of the one space.

3. The method of claim 1 wherein the step of forming a gate stack layer on a substrate comprises the steps of:
   i) forming in the substrate a groove having a width that is smaller than the gate;
   ii) forming an insulating layer over the substrate; and
   iii) depositing the gate stack layer.

4. The method of claim 3 wherein the step of forming in the substrate a groove having a width that is smaller than the gate comprises forming the groove by using hybrid photoresist.

5. The method of claim 1 further comprising the step of forming a deep trench capacitor in the substrate such that the deep trench capacitor has a storage electrode electrically connected to one of the first and second source/drain regions.

6. The method of claim 5 further comprising forming a bit line that is electrically connected to the other of the first and second source/drain regions.

7. The method of claim 1 wherein the step of patterning the gate stack layer to simultaneously define a gate and two spaces from a single image, with the gate situated between the two spaces, the gate and one of the two spaces having a total width that is approximately 2.0 F, wherein the gate has a width that is at least twice a width of the one space, comprises the step of using hybrid photoresist to define the gate and the two spaces, with the gate situated between the two spaces, the gate and one of the two spaces having a total width that is approximately 2.0 F, wherein the gate has a width that is at least twice a width of the one space.

8. The method of claim 1 wherein the gate stack layer further comprises an insulating layer and wherein the step of patterning the gate stack layer to simultaneously define a gate and two spaces from a single image, with the gate situated between the two spaces, the gate and one of the two spaces having a total width that is approximately 2.0 F, wherein the gate has a width that is at least twice a width of the one space, comprises the steps of:
   i) depositing a hybrid photoresist layer onto the gate stack layer;
   ii) exposing the hybrid photoresist layer through a mask comprising a shape such that first portions of the hybrid photoresist are exposed to a high exposure level, second portions of the hybrid photoresist are exposed to a medium exposure level, and third portions of the hybrid photoresist are exposed to a low exposure level;
   iii) developing the hybrid photoresist layer such that the second portions of the hybrid photoresist are removed, the removal of the second portions exposing two regions of the insulating layer;
   iv) etching the insulating layer;
   v) forming spacers over sidewalls of the insulating layer to reduce widths of the two regions of the insulating layer; and
   vi) etching the two regions of the insulating layer to form the two spaces, with the gate situated between the two spaces, the gate and one of the two spaces having a total width that is approximately 2.0 F, wherein the gate has a width that is at least twice a width of the one space.

9. The method of claim 8 wherein the step of developing the hybrid photoresist layer further exposes at least one loop, wherein the substrate further comprises a gate area in which the two regions of the insulating layer are formed and at least one support area in which the at least one loop is formed, and wherein the method, after the step of exposing the hybrid photoresist layer but before the step of developing the hybrid photoresist layer, further comprises the step of blanket exposing the at least one support area with at least an intermediate light energy capable of making the hybrid resist that is exposed in this step soluble to developer in the step of developing the hybrid photoresist layer.

10. The method of claim 1 wherein the step of patterning the gate stack layer to simultaneously define a gate and two spaces from a single image, with the gate situated between the two spaces, the gate and one of the two spaces having a total width that is approximately 2.0 F, wherein the gate has a width that is at least twice a width of the one space, comprises the steps of:

i) depositing a hybrid photoresist layer onto the gate stack layer;

ii) exposing the hybrid photoresist layer through a mask comprising a shape such that first portions of the hybrid photoresist are exposed to a high exposure level, second portions of the hybrid photoresist are exposed to a medium exposure level, and third portions of the hybrid photoresist are exposed to a low exposure level;

iii) developing the hybrid photoresist layer such that the second portions of the hybrid photoresist are removed, the removal of the second portions exposing two regions of the gate stack layer; and iv) etching the two regions of the gate stack layer to form the two spaces, with the gate situated between the two spaces, the gate and one of the two spaces having a total width that is approximately 2.0 F, wherein the gate has a width that is at least twice a width of the one space.

11. A The method of claim 1 wherein the step of patterning the gate stack layer to simultaneously define a gate and two spaces from a single image, with the gate situated between the two spaces, the gate and one of the two spaces having a total width that is approximately 2.0 F, wherein the gate has a width that is at least twice a width of the one space, comprises the steps of:

i) depositing a negative photoresist layer onto the gate stack layer;

ii) exposing the negative photoresist layer to define two regions of the negative photoresist layer;

iii) developing the negative photoresist layer to expose two regions of the gate stack layer;

iv) forming spacers over sidewalls of the negative photoresist layer to reduce widths of the two regions; and v) etching the two regions of the gate stack layer to form the two spaces, with the gate situated between the two spaces, the gate and one of the two spaces having a total width that is approximately 2.0 F, wherein the gate has a width that is at least twice a width of the one space.

12. The method of claim 11 wherein the gate stack layer further comprises an insulating layer that is beneath the negative photoresist layer, wherein the step of developing the negative photoresist layer further exposes at least one loop, wherein the substrate further comprises a gate area in which the two regions of the gate stack layer are formed and at least one support area in which the at least one loop is formed, and wherein the step of etching the two regions of the gate stack layer to form the two spaces, with the gate situated between the two spaces, the gate and one of the two spaces having a total width that is approximately 2.0 F, wherein the gate has a width that is at least twice a width of the one space, further comprises the steps of:

i) removing the negative layer of photoresist;

ii) etching through at least part of the insulating layer to create a hard mask;

ii) depositing a second layer of photoresist onto the gate stack layer;

iv) patterning the second layer of photoresist to create a trim mask in the at least one support area, the trim mask exposing the at least one loop;

v) etching a gate stack area in the trim mask to remove the at least one loop;

vi) removing the second layer of photoresist; and vii) etching the gate stack layer using the hard mask.

13. The method of claim 1 wherein the gate stack layer further comprises an insulating layer and wherein the step of patterning the gate stack layer to simultaneously define a gate and two spaces from a single image, with the gate situated between the two spaces, the gate and one of the two spaces having a total width that is approximately 2.0 F, wherein the gate has a width that is at least twice a width of the one space, comprises the steps of:

i) depositing a negative photoresist layer onto the gate stack layer;

ii) exposing the negative photoresist layer to define two regions of the negative resist layer;

iii) developing the negative photoresist layer to expose two regions of the insulating layer;

iv) etching the insulating layer;

v) forming spacers over sidewalls of the insulating layer to reduce widths of the two regions of the insulating layer; and vi) etching the two regions of the insulating layer to form the two spaces, with the gate situated between the two spaces, the gate and one of the two spaces having a total width that is approximately 2.0 F, wherein the gate has a width that is at least twice a width of the one space.

14. The method of claim 1 wherein the step of patterning the gate stack layer to simultaneously define a gate and two spaces from a single image, with the gate situated between the two spaces, the gate and one of the two spaces having a total width that is approximately 2.0 F, wherein the gate has a width that is at least twice a width of the one space, comprises the steps of:

i) depositing a negative photoresist layer onto the gate stack layer;

ii) exposing the negative photoresist layer through a mask comprising a first region that abuts a second region that also abuts a third region, wherein the first region and the third region are at a first phase and the second region is at a second phase that is about 180 degrees from the first phase, such that light that has passed through the second region will be about 180 degrees out of phase with light that has passed through the first and third regions, and wherein first portions of the negative photoresist are exposed to a high exposure level, and second portions of the negative photoresist are exposed to a low exposure level, the low exposure level occurring under the abutment of the first and second source/drain regions and the abutment of the second and third regions;

iii) developing the negative photoresist layer such that the second portions of the negative photoresist are removed, the removal of the second portions exposing two regions of the gate stack layer;

iv) forming spacers over sidewalls of the negative photoresist layer to reduce widths of the two regions; and v) etching the two regions of the gate stack layer to form the two spaces, with the gate situated between the two spaces, the gate and one of the two spaces having a total width that is approximately 2.0 F, wherein the gate has a width that is at least twice a width of the one space.

15. A method for forming a transistor in a memory device, the method comprising the steps of:

a) forming a gate stack layer on a substrate;

b) patterning the gate stack layer to simultaneously define a gate and two spaces from a single image, the step of patterning the gate stack layer comprising the steps of:

i) depositing a negative photoresist layer onto the gate stack layer;

ii) exposing the negative photoresist layer to define two regions of the negative photoresist layer;

iii) developing the negative photoresist layer to expose two regions of the gate stack layer; and iv) etching the two regions of the gate stack layer to form the two spaces, with the gate situated between the two spaces to form a space/line/space combination, the gate and one of the two spaces having a total width that is approximately 2.0 F, wherein the gate has a width that is at least twice a width of the one space; and c) forming first and second source/drain regions in the substrate on opposite sides of the gate.

16. The method of claim 15 further comprising the step of forming a deep trench capacitor in the substrate such that the deep trench capacitor has a storage electrode electrically connected to one of the first and second source/drain regions.

17. The method of claim 16 further comprising the step of forming a bit line that is electrically connected to the other of the first and second source/drain regions.

18. The method of claim 15 wherein the step of forming a gate stack layer on a substrate comprises the steps of:

i) forming in the substrate a groove having a width that is smaller than the gate;

ii) forming an insulating layer over the substrate; and iii) depositing the gate stack layer.

19. The method of claim 18 wherein the step of forming in the substrate a groove having a width that is smaller than the gate comprises forming the groove by using hybrid photoresist.

* * * * *